United States Patent
Brcka

(10) Patent No.: US 7,435,454 B2
(45) Date of Patent: Oct. 14, 2008

(54) PLASMA ENHANCED ATOMIC LAYER DEPOSITION SYSTEM AND METHOD

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 301 days.

(21) Appl. No.: 11/084,005

(22) Filed: Mar. 21, 2005

(65) Prior Publication Data

US 2006/0210713 A1  Sep. 21, 2006

(51) Int. Cl.
 *H05H 1/24* (2006.01)
 *H05H 1/46* (2006.01)
(52) U.S. Cl. .................. 427/569; 427/575; 427/576; 427/577; 427/578
(58) Field of Classification Search ............... None
 See application file for complete search history.

(56) References Cited

U.S. PATENT DOCUMENTS

| | | | |
|---|---|---|---|
| 6,723,642 B1 * | 4/2004 | Lim et al. | 438/680 |
| 6,936,535 B2 * | 8/2005 | Kim et al. | 438/656 |
| 2002/0144657 A1 * | 10/2002 | Chiang et al. | 118/723 E |
| 2003/0019917 A1 * | 1/2003 | Furuno et al. | 228/246 |
| 2003/0172872 A1 * | 9/2003 | Thakur et al. | 118/715 |
| 2004/0092132 A1 * | 5/2004 | Doan et al. | 438/785 |
| 2004/0224504 A1 * | 11/2004 | Gadgil | 438/680 |

* cited by examiner

*Primary Examiner*—Timothy Meeks
*Assistant Examiner*—Kelly M Stouffer
(74) *Attorney, Agent, or Firm*—Oblon, Spivak, McClelland, Maier & Neustadt, P.C.

(57) ABSTRACT

A method for depositing a film on a substrate using a plasma enhanced atomic layer deposition (PEALD) process includes disposing the substrate in a process chamber configured to facilitate the PEALD process, introducing a first process material within the process chamber and introducing a second process material within the process chamber. Electromagnetic power is coupled to the process chamber during introduction of the second process material in order to generate a plasma that facilitates a reduction reaction between the first and second process materials at a surface of the substrate, electromagnetic power is coupled to a gas injection electrode to generate a plasma that ionizes contaminants such that the ionized contaminants are attracted to a plurality of orifices in the gas injection electrode. The process chamber is vacuum pumped through the plurality of orifices to expel the ionized contaminants from the process chamber.

21 Claims, 26 Drawing Sheets

US 7,435,454 B2

PLASMA ENHANCED ATOMIC LAYER DEPOSITION SYSTEM AND METHOD

BACKGROUND OF THE INVENTION

1. Field of the Invention

The present invention relates to a plasma enhanced atomic layer deposition system and a method of operating thereof, and more particularly to a plasma enhanced atomic layer deposition system having reduced contamination.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine trenches or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of CVD or more generally film deposition, has emerged as a candidate for ultra-thin gate film formation in front end-of-line (FEOL) operations, as well as ultra-thin barrier layer and seed layer formation for metallization in back end-of-line (BEOL) operations. In ALD, two or more process gasses are introduced alternatingly and sequentially in order to form a material film one monolayer at a time. Such an ALD process has proven to provide improved uniformity and control in layer thickness, as well as conformality to features on which the layer is deposited. However, current ALD processes generally have a slow deposition rate that is not feasible for production requirements. Moreover, current ALD processes often suffer from contamination problems that affect the quality of the deposited films, and thus the manufactured device. Factors such as these have been an impediment to wide acceptance of ALD films despite their superior characteristics.

SUMMARY OF THE INVENTION

Accordingly, one object of the present invention is directed to addressing any of the above-described and/or other problems with ALD systems and processes.

Another object of the present invention is to reduce contamination problems relating to deposition of ALD films.

These and/or other objects of the present invention may be provided by a method for depositing a film on a substrate using a plasma enhanced atomic layer deposition (PEALD) process. In one aspect, the method includes disposing the substrate in a process chamber configured to facilitate the PEALD process, introducing a first process material within the process chamber and introducing a second process material within the process chamber. Electromagnetic power is coupled to the process chamber during introduction of the second process material in order to generate a plasma that facilitates a reduction reaction between the first and second process materials at a surface of the substrate, electromagnetic power is coupled to a gas injection electrode to generate a plasma that ionizes contaminants such that the ionized contaminants are attracted to a plurality of orifices in the gas injection electrode. The process chamber is vacuum pumped through the plurality of orifices to expel the ionized contaminants from the process chamber.

Another aspect of the invention includes an atomic layer deposition system having a process chamber, a substrate holder provided within the process chamber, and configured to support a substrate, a first process material supply system configured to supply a first process material to the process chamber and a second process material supply system configured to supply a second process material to the process chamber. Also included is a gas injection electrode configured to generate a plasma that ionizes contaminants such that the ionized contaminants are attracted to a plurality of orifices in the gas injection electrode, and a vacuum pump coupled to the plurality of orifices and configured to pump the process chamber through the plurality of orifices to expel the ionized contaminants from the process chamber.

Still another aspect of the invention includes an atomic layer deposition system including a process chamber, means provided within the process chamber for supporting a substrate, means for supplying a first process material to the process chamber and means for supplying a second process material to the process chamber. Also included is means for coupling electromagnetic power to the process chamber during introduction of the second process material in order to generate a plasma that facilitates a reduction reaction between the first and second process materials at a surface of the substrate, and means for coupling electromagnetic power to a gas injection electrode to generate a plasma that ionizes contaminants such that the ionized contaminants are attracted to a plurality of orifices in the gas injection electrode. Means for vacuum pumping pumps the process chamber through the plurality of orifices to expel the ionized contaminants from the processing chamber.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1A:
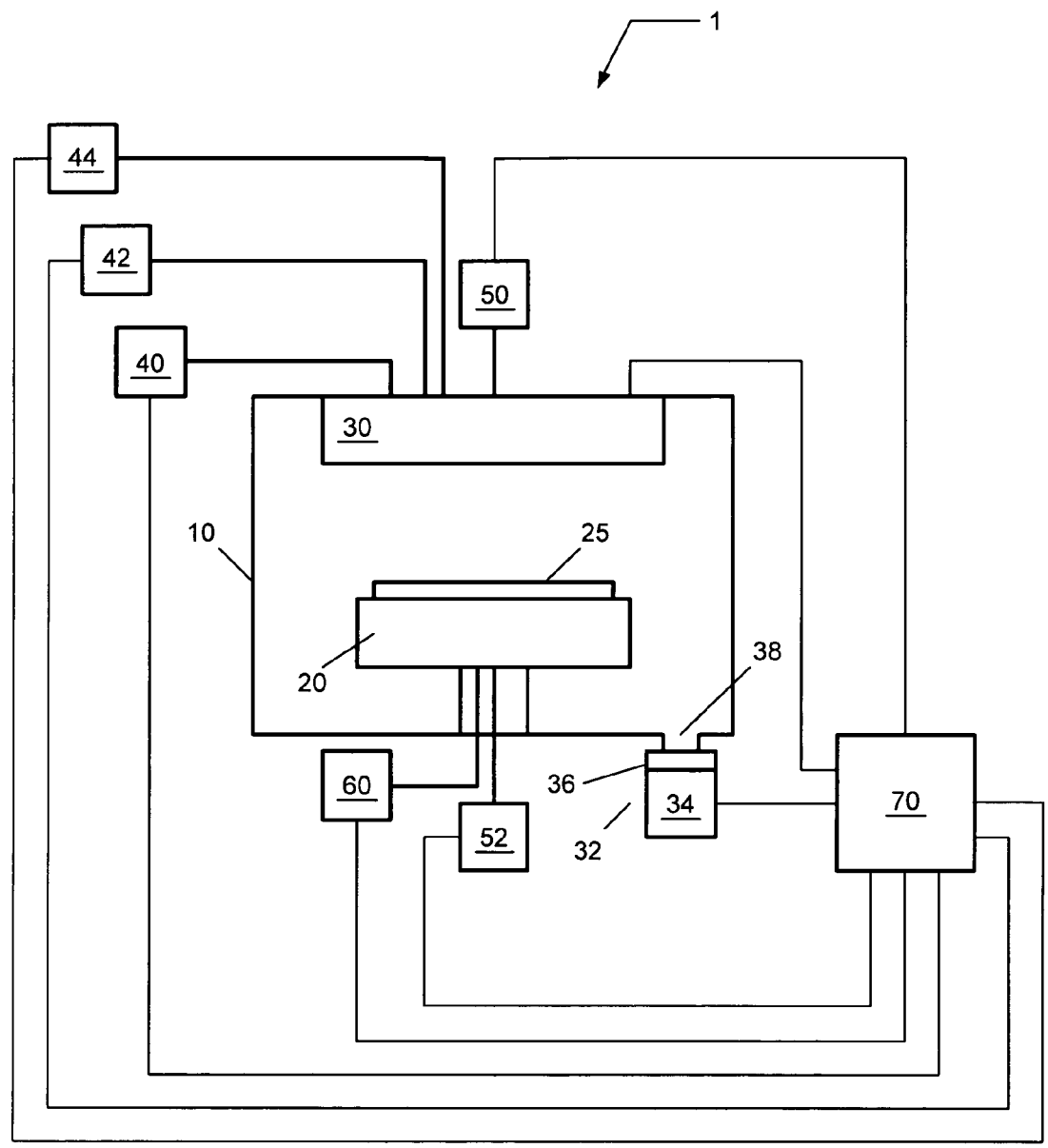
FIG. 1A depicts a schematic view of a deposition system in accordance with an embodiment of the invention.

Referring now to the drawings, wherein like reference numerals designate identical or corresponding parts throughout the several views, FIG. 1A illustrates a deposition system 1 for depositing a thin film on a substrate according to one embodiment. For example, during the metallization of interconnect and intra-connect structures for semiconductor devices in back-end-of-line (BEOL) operations, a thin conformal barrier layer may be deposited on wiring trenches or vias to minimize the migration of metal into the inter-level or intra-level dielectric. Further, a thin conformal seed layer may be deposited on wiring trenches or vias to provide a film with acceptable adhesion properties for bulk metal fill, or a thin conformal adhesion layer may be deposited on wiring trenches or vias to provide a film with acceptable adhesion properties for metal seed deposition. In front-end-of line (FEOL) operations, the deposition system 1 may be used to deposit an ultra thin gate layer, and/or a gate dielectric layer such as a high dielectric constant (high-K) film.

The deposition system 1 comprises a process chamber 10 having a substrate holder 20 configured to support a substrate 25, upon which the thin film is formed. The process chamber 10 further comprises an upper assembly 30 coupled to a first process material supply system 40, a second process material supply system 42, and a purge gas supply system 44. Additionally, the deposition system 1 comprises a first power source 50 coupled to the process chamber 10 and configured to generate plasma in the process chamber 10, and a substrate temperature control system 60 coupled to substrate holder 20 and configured to elevate and control the temperature of substrate 25. Additionally, deposition system 1 comprises a controller 70 that can be coupled to process chamber 10, substrate holder 20, upper assembly 30, first process material supply system 40, second process material supply system 42, purge gas supply system 44, first power source 50, and substrate temperature control system 60.

Alternately, or in addition, controller 70 can be coupled to one or more additional controllers/computers (not shown), and controller 70 can obtain setup and/or configuration information from an additional controller/computer.

In FIG. 1A, singular processing elements (10, 20, 30, 40, 42, 44, 50, and 60) are shown, but this is not required for the invention. The deposition system 1 can comprise any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Referring still to FIG. 1A, the deposition system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternatingly introduce a first process material to process chamber 10 and a second process material to process chamber 10. The alternation of the introduction of the first material and the introduction of the second material can be cyclical, or it may be acyclical with variable time periods between introduction of the first and second process materials. The first process material can, for example, comprise a film precursor, such as a composition having the principal atomic or molecular species found in the film formed on substrate 25. For instance, the film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a Noble gas (i.e., helium, neon, argon, xenon, krypton), or nitrogen, or hydrogen. In one embodiment, the purge gas supply system 44 can also be configured to introduce a reactive purge gas as will be described below.

Referring still to FIG. 1A, the deposition system 1 comprises a plasma generation system configured to generate a plasma during at least a portion of the alternating introduction of the first process material and the second process material to process chamber 10. The plasma generation system can include a first power source 50 coupled to the process chamber 10, and configured to couple power to the first process material, or the second process material, or both in process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in plasma process chamber 10 by reducing the reflected power. Match network topologies (e.g. L-type, π-type, T-type, etc.) and automatic control methods are well known to those skilled in the art.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

Figure 1B:
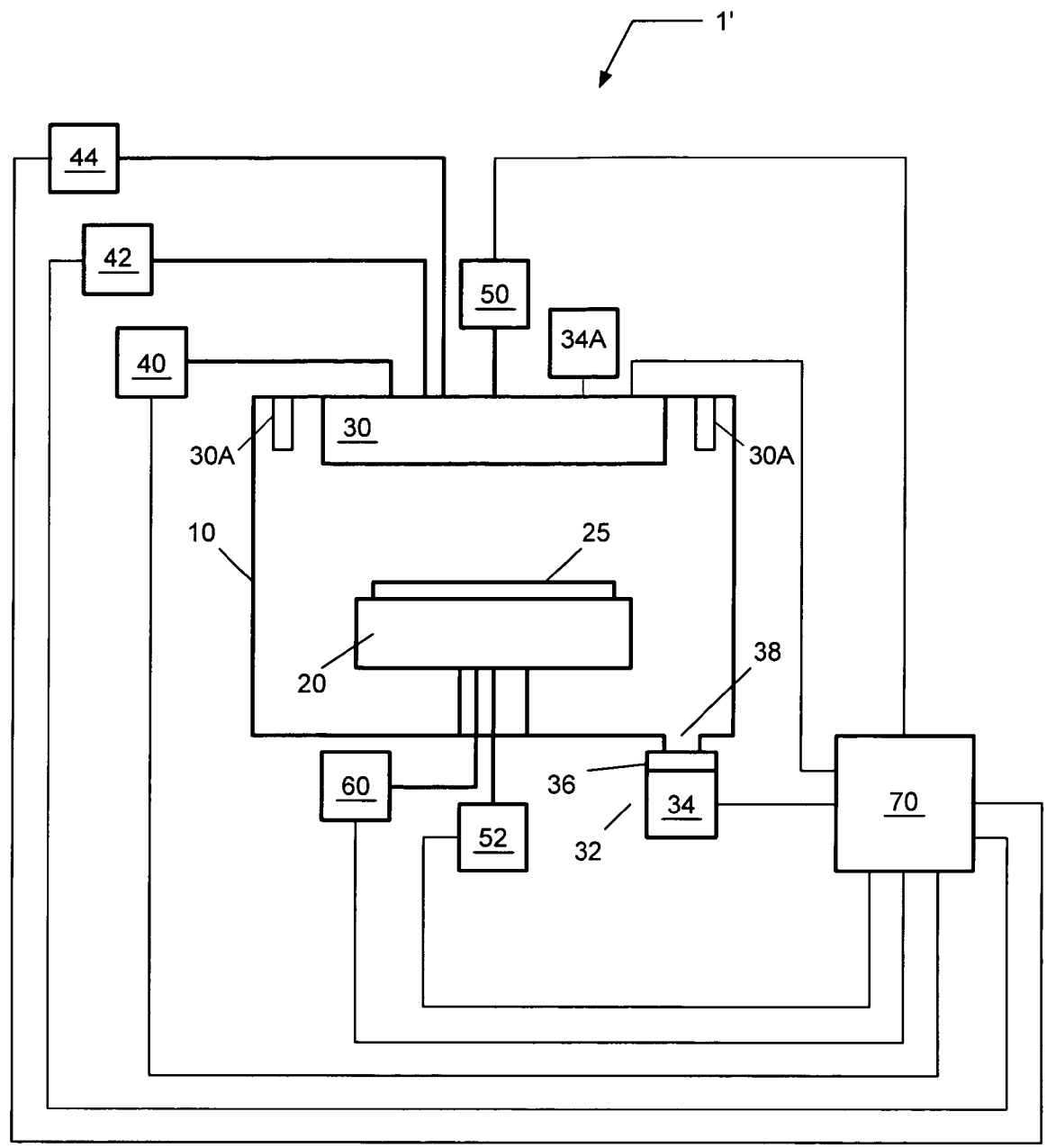
FIG. 1B depicts a schematic view of another deposition system in accordance with an embodiment of the invention.

Optionally, the plasma generation system includes a first electrode in the upper assembly 30, and a second electrode 30A positioned at a periphery of the upper assembly 30 of deposition system 1' as shown in FIG. 1B. In an embodiment, the second electrode 30A is placed beyond an outer edge of the substrate 25. Moreover, electrode 30A may include a gas injection assembly configured to inject a plasma generating gas, as will be further described herein. Power may be coupled to second electrode 30A from the first power source 50, or from an independent power source not shown in FIG. 1B. Where the electrode 30A is powered from the power source 50, a power divider network may be used to ensure that the power provided on the electrode 30A differs in phase, and/or amplitude, and/or frequency from the power provided on an electrode of upper assembly 30. The power source supplying power to the electrode 30A may be any of the configurations described with respect to power source 50, or other suitable configurations may be used. For example, electrode 30A may comprise a ring electrode, a single-turn coil, or a helical coil coupled to radio frequency (RF) power. Other inductively coupled devices can be used to supply an electromagnetic power into a plasma. For example, one such device is described in pending U.S. patent application Ser. No. 10/717,268, entitled "Plasma Processing System with Locally-Efficient Inductive Plasma Coupling". A typical frequency for the power supply can range from about 0.1 MHz to about 100 MHz.

Optionally, the deposition system 1 comprises a substrate bias generation system configured to generate or assist in generating a plasma during at least a portion of the alternating introduction of the first process material and the second process material to process chamber 10. The substrate bias system can include a substrate power source 52 coupled to the process chamber 10, and configured to couple power to substrate 25. The substrate power source 52 may include a radio frequency (RF) generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternately, RF power is applied to the substrate holder electrode at multiple frequencies.

Although the plasma generation system and the optional substrate bias system are illustrated in FIG. 1A as separate entities, they may indeed comprise one or more power sources coupled to substrate holder 20. Further, the power source used to power electrode 30A, as shown in FIG. 1B, may be combined with one or both of power sources 50 and 52.

Still referring to FIG. 1A, deposition system 1 comprises substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the process chamber 10 and any other component within the deposition system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials. As seen in FIG. 1A, the deposition system 1 may optionally include a vacuum pump 34A suitable for vacuum pumping through gas injection holes in the upper assembly 30, as will be further described below.

While shown schematically in FIG. 1A, the vacuum pump 34A may include a valve and duct such as that used in vacuum pump 34.

The vacuum pumping systems 34 and 34A can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etch, a 300 to 5000 liter per second TMP is generally employed. Moreover, a device for monitoring chamber pressure (not shown) can be coupled to the process chamber 10. The pressure measuring device can be, for example, a Type 628B Baratron absolute capacitance manometer commercially available from MKS Instruments, Inc. (Andover, Mass.).

Still referring to FIG. 1A and FIG. 1B, controller 70 can comprise a microprocessor, memory, and a digital I/O port capable of generating control voltages sufficient to communicate and activate inputs to deposition system 1 (1') as well as monitor outputs from deposition system 1 (1'). Moreover, the controller 70 may be coupled to and may exchange information with the process chamber 10, substrate holder 20, upper assembly 30, electrode 30A, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 (1') according to a process recipe in order to perform an etching process, or a deposition process. One example of the controller 70 is a DELL PRECISION WORKSTATION 610™, available from Dell Corporation, Austin, Tex.

However, the controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the deposition system 1 (1'), or it may be remotely located relative to the deposition system 1 (1'). For example, the controller 70 may exchange data with the deposition system 1 (1') using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 (1') via a wireless connection.

Figure 2A:
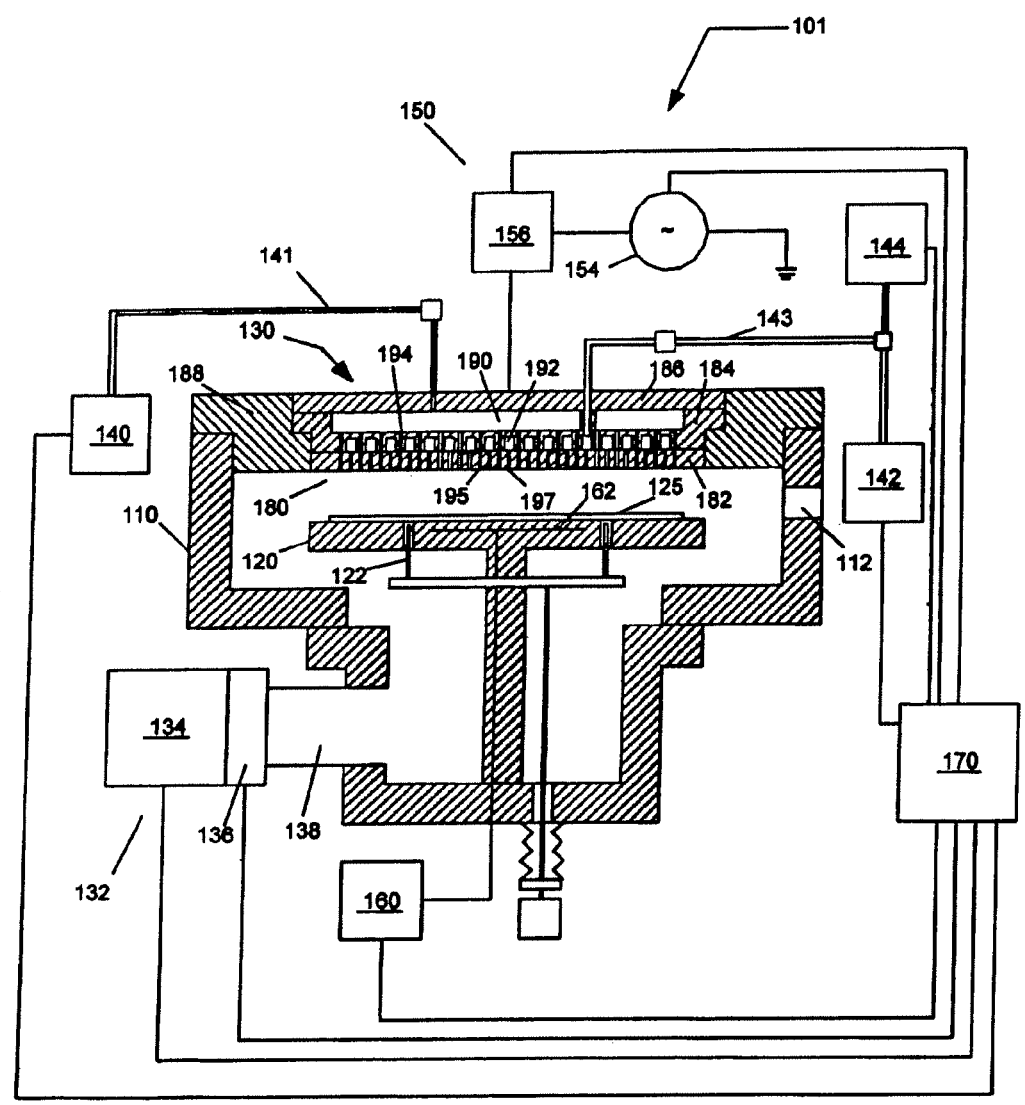
FIG. 2A depicts a schematic view of a deposition system in accordance with an embodiment of the invention.

Referring now to FIG. 2A, a deposition system 101 is depicted. The deposition system 101 comprises a process chamber 110 having a substrate holder 120 configured to support a substrate 125, upon which the thin film is formed. The process chamber 110 further comprises an upper assembly 130 coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120, which contains a heater 162, and configured to elevate and control the temperature of substrate 125. Additionally, deposition system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1A and FIG. 1B above.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternatingly introduce a first process material to process chamber 110 and a second process material to process chamber 110. The alternation of the introduction of the first material and the introduction of the second material can be cyclical, or it may be acyclical with variable time periods between introduction of the first and second materials. The first process material can, for example, comprise a film precursor, such as a composition having the principal atomic or molecular species found in the film formed on substrate 125. For instance, the film precursor can originate as a solid phase, a liquid phase, or a gaseous phase, and it may be delivered to process chamber 110 in a gaseous phase, and with or without a carrier gas. The second process material can, for example, comprises a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

The first process material and the second process material are chosen in accordance with the composition and characteristics of a material to be deposited on the substrate. For example, during the deposition of tantalum (Ta) as a barrier layer, the first process material can include a solid film precursor, such as tantalum pentachloride ($TaCl_5$), and the second process material can include a reducing agent, such as hydrogen ($H_2$) gas. In another example, during the deposition of tantalum nitride (TaN) or tantalum carbonitride (TaCN) as a barrier layer, the first process material can include a metal organic film precursor, such as tertiary amyl imido-tris-dimethylamido tantalum ($Ta(NC(CH_3)_2C_2H_5)(N(CH_3)_2)_3$, hereinafter referred to as Taimata®; for additional details, see U.S. Pat. No. 6,593,484), and the second process material can include a reducing agent, such as hydrogen ($H_2$), ammonia ($NH_3$), silane ($SiH_4$), or disilane ($Si_2H_6$), or a combination thereof. In another example, when depositing tantalum nitride (i.e., $TaN_x$), the first precursor can include a tantalum-containing precursor, such as $TaCl_5$, PDEAT (pentakis(diethylamido) tantalum), PEMAT (pentakis(ethylmethylamido)tantalum), $TaBr_5$, or TBTDET (t-butylimino tris (diethylamino)tantalum). The second precursor can include a mixture of $H_2$ and $N_2$, or $NH_3$. Still further, when depositing tantalum pentoxide, the first process material can include $TaCl_5$, and the second process material can include $H_2O$, or $H_2$ and $O_2$. Other examples of first and second process material will be provided below with respect to FIG. 5.

Additionally, the purge gas supply system 144 can be configured to introduce a purge gas to process chamber 110. For example, the introduction of purge gas may occur between introduction of the first process material and the second process material to process chamber 110, or following the introduction of the second process material to process chamber 110, respectively. The purge gas can comprise an inert gas, such as a Noble gas (i.e., helium, neon, argon, xenon, krypton), or nitrogen, or hydrogen. In one embodiment, the purge gas supply system 144 can also be configured to introduce a reactive purge gas in to chamber 110 as will be further described herein.

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1A and FIG. 1B, the flow control devices can include pneumatic driven valves, electro-mechanical (solenoidal) valves, and/or high-rate pulsed gas injection valves. An exemplary pulsed gas injection system is described in greater detail in pending U.S. application 60/272,452, filed on Mar. 2, 2001, which is incorporated herein by reference in its entirety.

Referring still to FIG. 2A, the first process material is coupled to process chamber 110 through first material line 141, and the second process material is coupled to process chamber 110 through second material line 143. Additionally, the purge gas may be coupled to process chamber 110 through the first material line 141 (as shown), the second material line 143 (as shown), or an independent line, or any combination thereof. In the embodiment of FIG. 2A, the first process material, second process material, and purge gas are introduced and distributed within process chamber 110 through the upper assembly 130 that includes gas injection assembly 180. While not shown in FIG. 2A, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188. The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both, is coupled from the second process material supply system 142 or purge gas supply system 144 to process chamber 110 through a second array of orifices 197 in the first injection plate 182 via a second plenum 192 formed in the second injection plate 184.

Referring still to FIG. 2A, the deposition system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both, in process chamber 110. The first power source 150 may be variable and includes a radio frequency (RF) generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

Figure 2B:
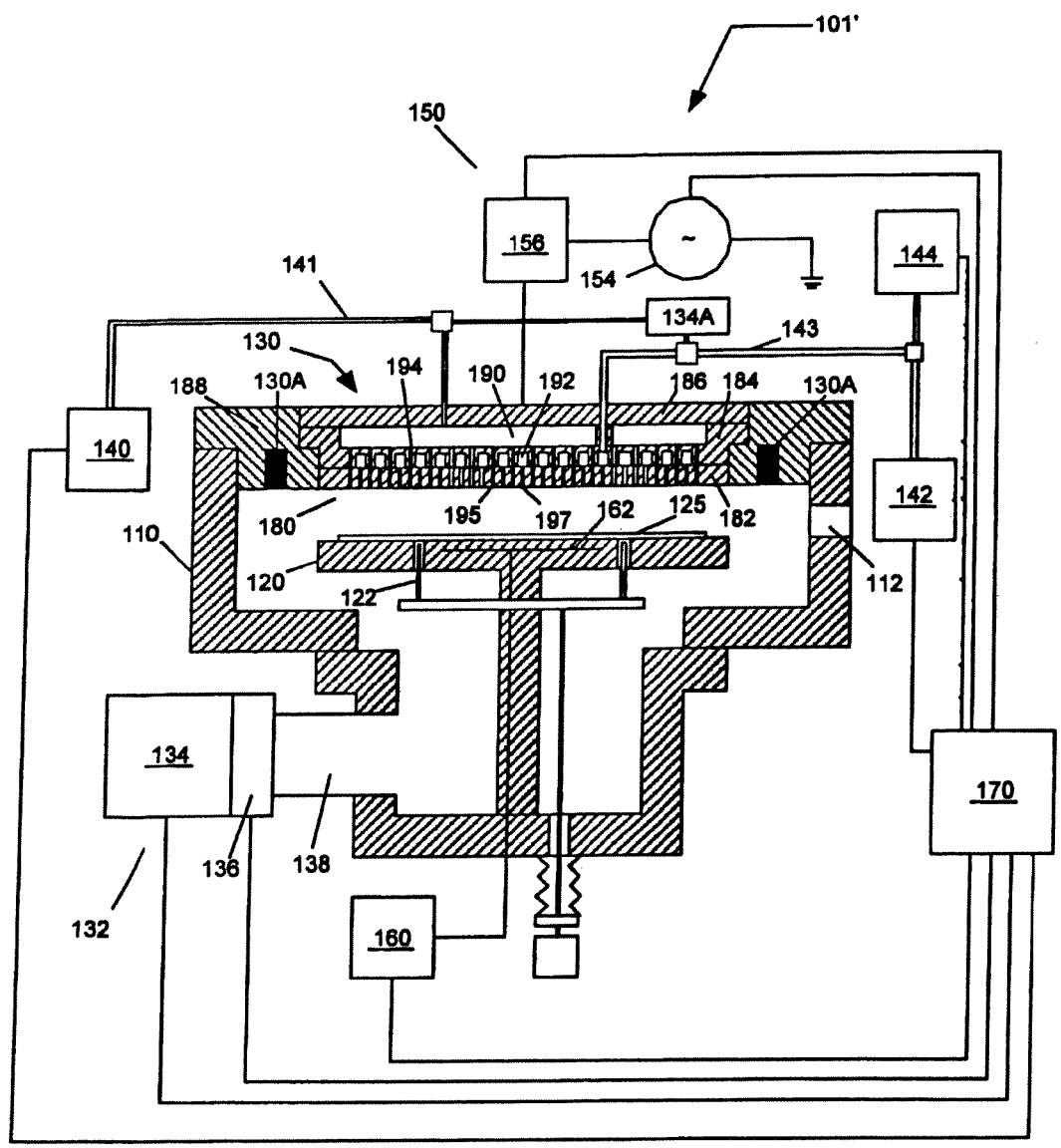
FIG. 2B depicts a schematic view of another deposition system in accordance with an embodiment of the invention.

Optionally, the plasma generation system includes a first electrode in the upper assembly 130, and a second electrode 130A positioned at a periphery of the upper assembly 130 as shown in deposition system 101' of FIG. 2B. In an embodiment, the second electrode 130A is placed beyond the outer edge of the substrate 125. Electrode 130A may also include a gas injection assembly configured to inject a plasma generating gas. Power may be coupled to second electrode 130A from the first power source 150, or from an independent power source not shown in FIG. 2B. Where the electrode 130A is powered from the power source 150A, a power divider network may be used to allow the power provided on the electrode 130A to differ from the power provided on an electrode of upper assembly 130 in characteristics such as phase, frequency, power level etc. The power source supplying power to the electrode 130A may be any of the configurations described with respect to power source 150, or other suitable configurations may be used. For example, electrode 130A may comprise a ring electrode, a single-turn coil, or a helical coil coupled to radio frequency (RF) power. For example, one such device is described in pending U.S. patent application Ser. No. 10/717,268, entitled "Plasma Processing System with Locally-Efficient Inductive Plasma Coupling". A typical frequency for the power supply can range from about 0.1 MHz to about 100 MHz.

Still referring to FIG. 2A, deposition system 101 comprises substrate temperature control system 160 coupled to the substrate holder 120 and configured to elevate and control the temperature of substrate 125. Substrate temperature control system 160 comprises at least one temperature control element, including a resistive heating element such as an aluminum nitride heater. The substrate temperature control system 160 can, for example, be configured to elevate and control the substrate temperature up to from approximately 350° C. to 400° C. Alternatively, the substrate temperature can, for example, range from approximately 150° C. to 350° C. It is to be understood, however, that the temperature of the substrate is selected based on the desired temperature for causing ALD deposition of a particular material on the surface of a given substrate. Therefore, the temperature can be higher or lower than described above.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials. As seen in FIG. 2B, the deposition system 101' may optionally include a vacuum pump 134A suitable for vacuum pumping through gas injection holes in the upper assembly 130, as will be further described below. While shown schematically in FIG. 1B, the vacuum pump 134A may include a valve and duct such as that used in vacuum pump 134A. The valve of vacuum pumping system can be capable of selective pumping of line 141 and 143. Further, the vacuum pump 134A may be coupled to orifices in the peripheral electrode 130A to provide a vacuum pump feature on this electrode.

Figure 3:
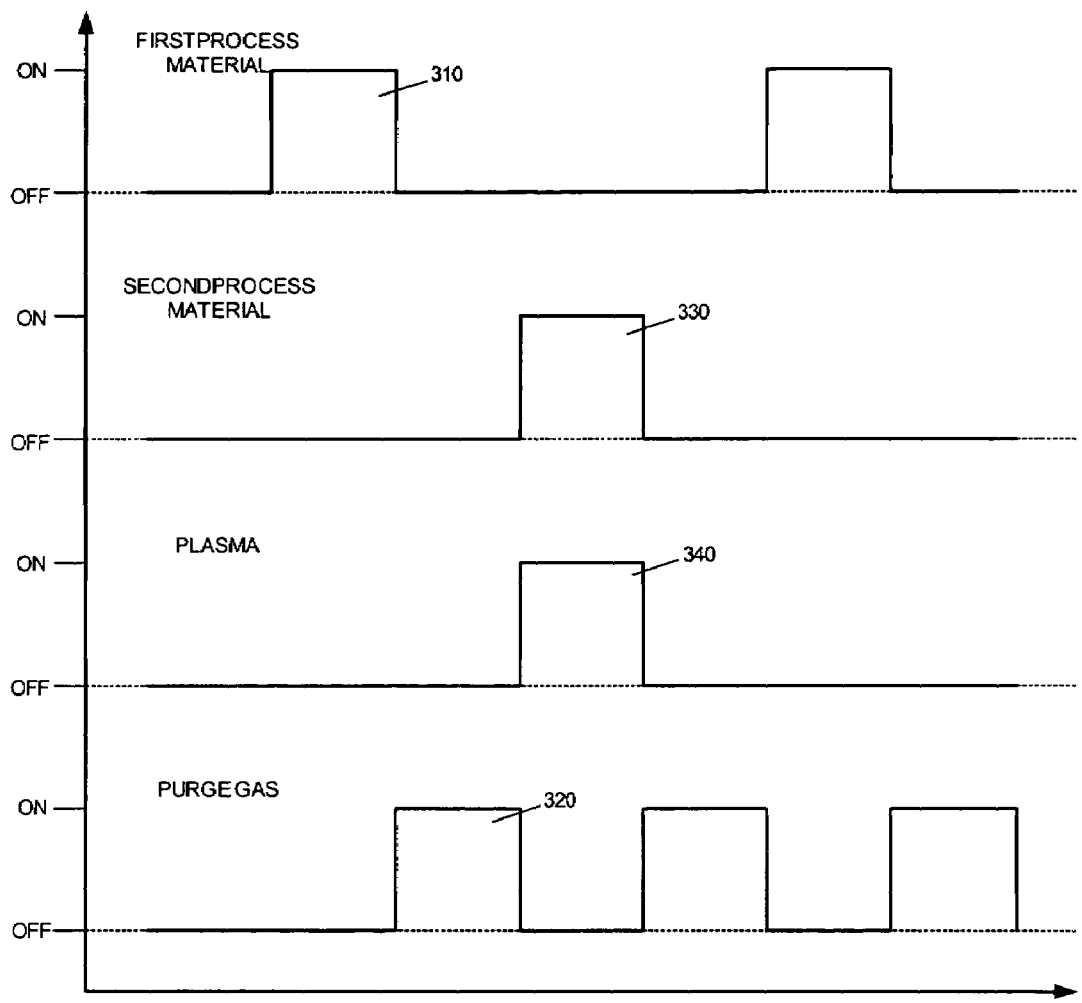
FIG. 3 is a timing diagram for an ALD process according to an embodiment of the invention.

Referring now to FIG. 3, deposition system 1/1'/101/101' (denoted by FIGS. 1A, 1B/FIGS. 2A, 2B reference numeral) can be configured to perform a plasma enhanced atomic layer deposition (PEALD) process according to an embodiment of the present invention. FIG. 3 is a timing diagram for an exemplary PEALD process in accordance with an exemplary embodiment of the present invention. As seen in this figure, a first process material is introduced to process chamber 10/110 for a first period of time 310 in order to cause adsorption of the film precursor (first process material) on exposed surfaces of substrate 25/125, then the process chamber 10/110 is purged with a purge gas for a second period of time 320. Thereafter, a reducing agent (second process material), is introduced to process chamber 10/110 for a third period of time 330 while power is coupled through the upper assembly 30/130 from the first power source 50/150 to the reducing agent as shown by 340. The coupling of power to the reducing agent heats the reducing agent, thus causing ionization and/or dissociation of the reducing agent in order to form a radical that chemically reacts with the first precursor adsorbed on substrate 25/125. When substrate 25/125 is heated to an elevated temperature, the surface chemical reaction facilitates the formation of the desired film. The process chamber 10/110 is purged with a purge gas for a fourth period of time. The introduction of the first and second process materials, and the formation of plasma can be repeated any number of times to produce a film of desired thickness on the substrate.

While FIG. 3 shows discrete pulses of the first process material, the first process material may be a continuous flow, for example on a carrier gas, where such continuous flow will not cause undesirable reaction with the second process material prior to deposition on the substrate surface. While FIG. 3 shows plasma generation only during the reduction gas period, a plasma may also be generated during the first process material period in order to facilitate adsorption of the first process material to the substrate surface. Moreover, although the second process material time period 330 and the plasma time period 340 are shown in FIG. 3 to exactly correspond to one another, it is sufficient for purposes of the present invention that such time periods merely overlap, as would be understood by one of ordinary skill in the art.

As discussed in the Related Art section above, one impediment to wide acceptance of ALD processes has been the relatively slow deposition rate of such processes. In particular, conventional ALD processes typically require a cycle of approximately 15-20 seconds to deposit a single layer of material, with the reduction reaction typically accounting for approximately 10 seconds of the cycle time. The present inventors have studied the process parameters of conventional ALD processes in an effort to reduce this deposition time (or improve the deposition rate). As a consequence, the present inventors have determined that the conventional plasma power of 600 W or less may be increased to accelerate the reduction reaction time. For example, in performing a PEALD process such as that described in FIG. 3 to prepare a thin, conformal, tantalum-containing film, using tantalum pentachloride as the first process material, and hydrogen as the second process material, approximately 1000 W of power was coupled to the hydrogen reducing agent. With this power level, completion of the reduction reaction to saturation was achieved in approximately 5 seconds, rather than the approximately 10 seconds typical for a 600 W plasma power process.

For instance, process parameters are provided in Table 1 for an exemplary PEALD process for forming a thin film of tantalum (Ta) using tantalum pentachloride as the first process material and hydrogen as the second process material during the reduction step.

TABLE 1

Figure 4A:
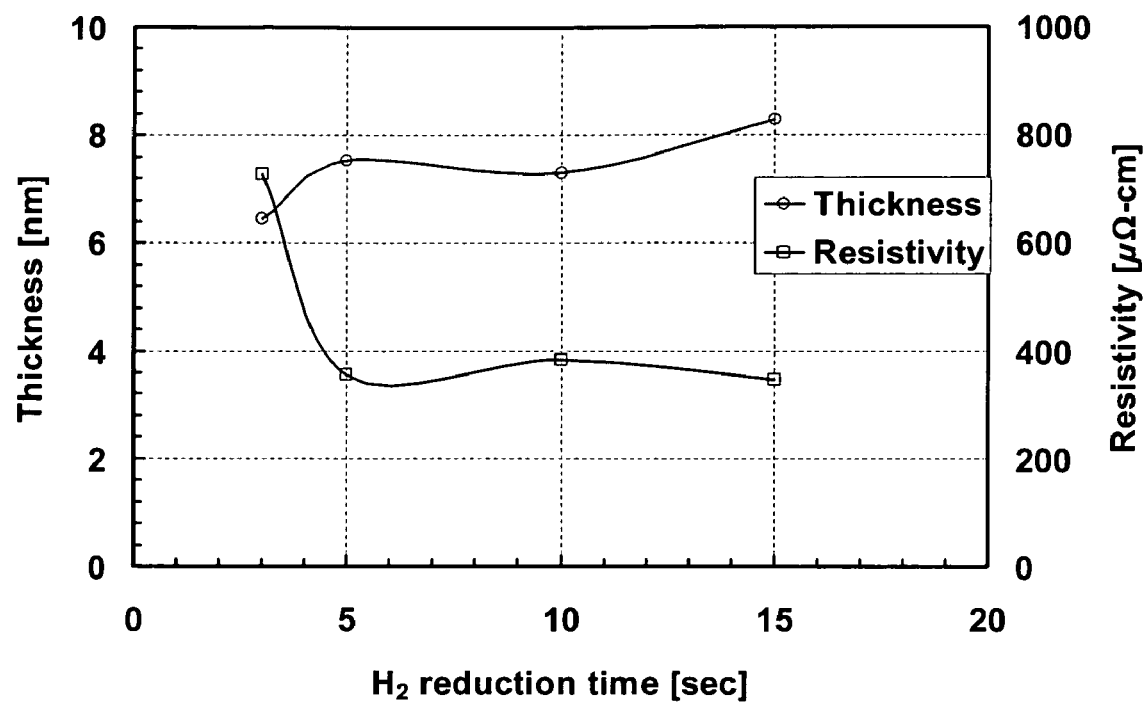
FIGS. 4A-4C present exemplary ALD process data.
Figure 4B:
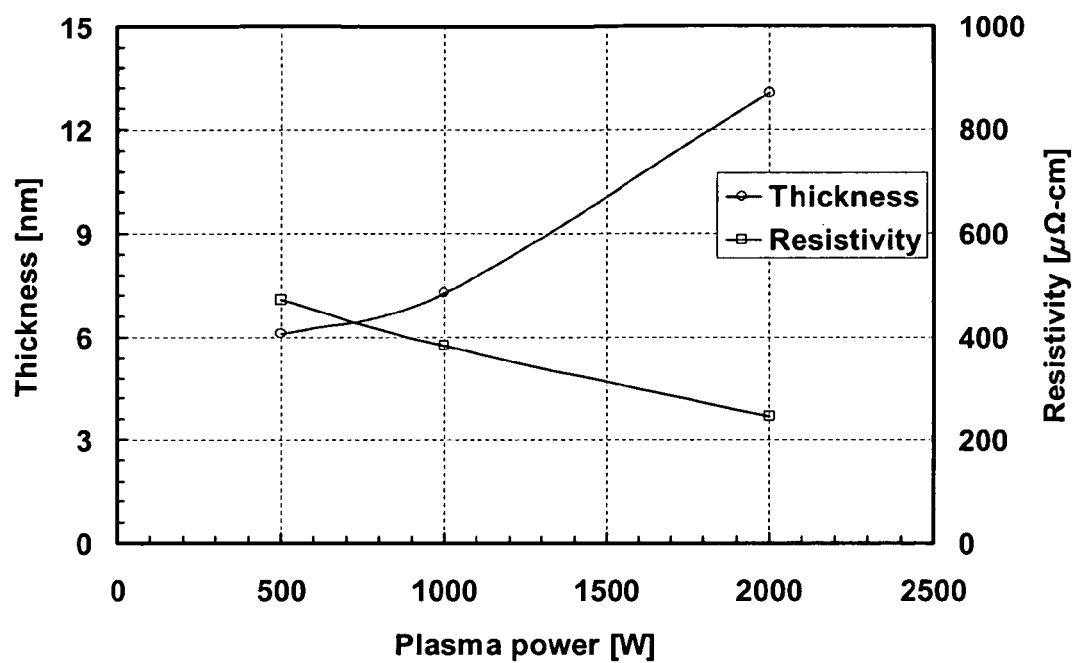

| | $TaCl_5$ (deg C.) | Carrier Ar (sccm) | $H_2$ (sccm) | Ar (sccm) | Time (sec) | Power (W) | P (Torr) |
|---|---|---|---|---|---|---|---|
| $TaCl_5$ | 140 | 20 | 0 | 500 | 3 | 0 | |
| Purge | 0 | 0 | 2000 | 0 | 3 | 0 | |
| $H_2$ | 0 | 0 | 2000 | 0 | 10 for FIG. 4B | 1000 for FIG. 4A | 0.4 |
| Purge | 0 | 0 | 0 | 500 | 3 | 0 | |

Table 1 provides columns including, from left to right, the ALD process step, the temperature set for the evaporation system configured to sublime the first process material, $TaCl_5$, the flow rate of Ar (carrier Ar, sccm) passing through the evaporation system, the flow rate of hydrogen ($H_2$ sccm) during the reduction step, the flow rate of Ar (Ar, sccm) coupled directly to the process chamber, the time for each step, the power applied during each step, and the pressure set for each step. Additionally, the tantalum film is formed on a silicon dioxide ($SiO_2$) substrate using 300 cycles as described in Table 1, while the temperature of the substrate is set to approximately 240 degrees C. FIGS. 4A and 4B present process data for the exemplary PEALD process depicted in Table 1.

In FIG. 4A, each process parameter is held constant, including the power during the reduction step (i.e., 1000 W), while the time for the reduction step is varied from approximately three (3) seconds to fifteen (15) seconds. When the power is increased to 1000 W, the time for the reduction step can be approximately 5 seconds or greater. At this latter time duration, the film thickness and the film resistivity become constant with increasing time.

In FIG. 4B, each process parameter is held constant, including the time duration for the reduction step (i.e., 10 seconds), while the power applied during the reduction step is varied from approximately 500 W to approximately 2000 W. As the power is increased, the film thickness increases and the film resistivity decreases. For example, a tantalum film having a resistivity less than approximately 460 $\mu\Omega$-cm can be formed.

Thus, the present inventors have discovered that increasing the plasma power over the conventional limit of approximately 600 W can improve the deposition rate of ALD films, as well as film characteristics such as film resistivity. Moreover, the present inventors have recognized that the use of such a relatively high plasma power provides a more complete release of byproducts from the first process material layer on the substrate, during the reduction reaction when the second process material is introduced to the chamber. Returning to the example above, where tantalum pentachloride is first adsorbed onto the substrate surface, a hydrogen plasma generated at approximately 1000 W will release more chlorine from the tantalum pentachloride layer than a plasma generated at 600 W.

Figure 4C:
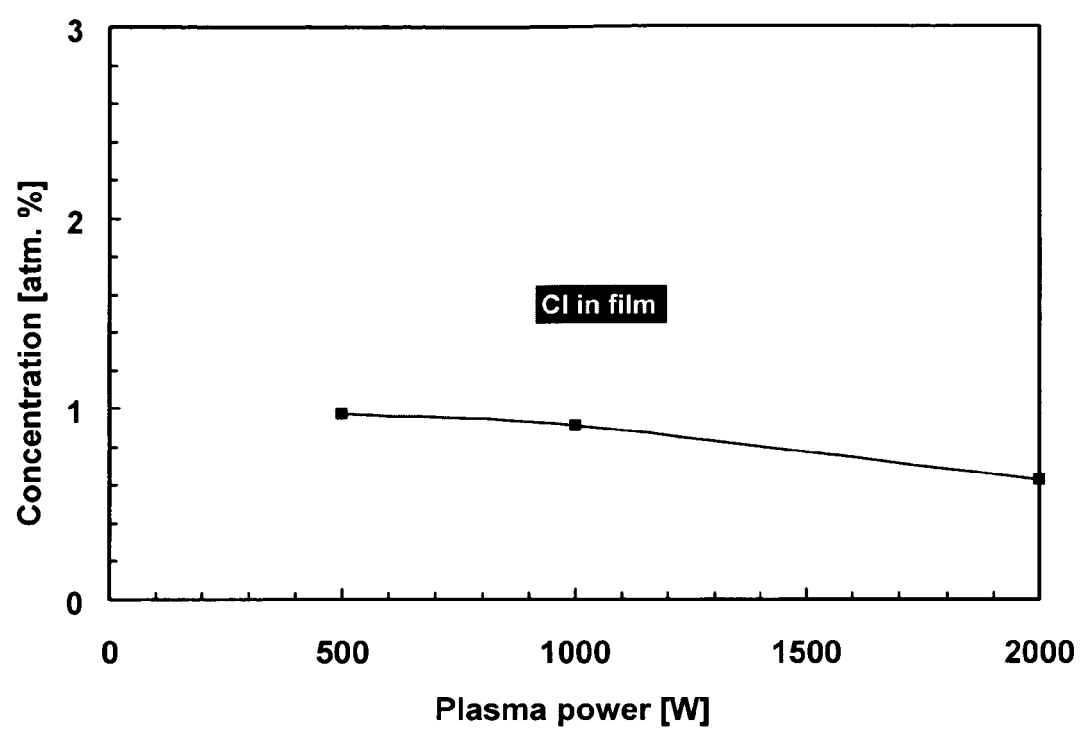

For example, FIG. 4C shows a decrease in the chlorine content of the tantalum film for the PEALD process described above, as the power applied during the reduction step is increased from approximately 500 W to approximately 2000 W. Hence, an increase in power provides a film that has a reduced amount of chemical by-product impurities, which results in improved film characteristics such as resistivity or dielectric constant. For example, a tantalum film having a chlorine content less than 0.95 atomic percent (at. %) can be formed.

For instance, one explanation for the reduced reduction reaction time at higher plasma power is that the increased power provides a higher density of radicals in the plasma, such as $H^+$ in a hydrogen plasma, that can react with the first precursor on the substrate surface. The availability of more radicals provides for a shorter saturation time in the reduction reaction.

Furthermore, for instance, according to another explanation, reduction on the surface can depend on the surface temperature and, hence, the reduction process should depend on temperature according the Arrhenius relation, i.e., $R \cong R_0 \exp(-E_{activation}/kT_{surface})$ It is known that plasma produces an apparently lower activation energy than the activation energy in an electrically neutral gas environment. The mechanism for reduced activation energy is caused by ion-neutral interactions, rather than neutral-neutral interaction. Due to reduced apparent activation energy, more reaction products are generated in time, or saturation occurs sooner.

For example, one interpretation is that an increase in plasma power generates a greater reduction in activation energy, whereas less plasma power generates less reduction or zero change in the activation energy. Assuming that for a first plasma power ($P_1$), the amount of released chlorine (Cl) in time interval ($\Delta t$) from tantalum pentachloride ($TaCl_5$) by hydrogen radicals (H.) is proportional to the reactant(s) density and to the rate constant with Arrhenius dependence on the temperature, that is $$\Delta n_{Cl}(P_1) = R_0(P_1) \times n_H(P_1) \times n_{TaCl_5} \times \Delta t.$$

At a second plasma power ($P_2$), such that ($P_2 > P_1$), the released amount of (Cl) is proportional to $$\Delta n_{Cl}(P_2) = R_0(P_2) \times n_H(P_2) \times n_{TaCl_5} \times \Delta t.$$

Based on the assumption that ($E_2^A < E_1^A$) at ($P_2 > P_1$), and considering ($E_2^A = \alpha E_1^A$) where ($\alpha \leq 1$), we can rewrite both relations in a form (considering the same time interval)

$$\Delta n_{Cl}(P_{1,2}) = R_0 \exp(-E_{1,2}^A/kT_{1,2}) \times n_H(P_{1,2}) \times n_{TaCl_5} \times \Delta t.$$

Now the ratio of released (Cl) densities for both cases becomes $$\frac{\Delta n_{Cl}(P_2)}{\Delta n_{Cl}(P_1)} = \frac{R_0 \exp(-E_2^A/kT_2) n_H(P_2) n_{TaCl_5} \Delta t}{R_0 \exp(-E_1^A/kT_1) n_H(P_1) n_{TaCl_5} \Delta t},$$

e.g.

$$\frac{\Delta n_{Cl}(P_2)}{\Delta n_{Cl}(P_1)} = \frac{n_H(P_2)}{n_H(P_1)} \exp\left(-\frac{E_2^A T_1 - E_1^A T_2}{kT_1 T_2}\right)$$

$$= \frac{n_H(P_2)}{n_H(P_1)} \exp\left(\frac{E_1^A}{kT_1} \frac{T_2 - \alpha T_1}{T_2}\right).$$

Deconvolution of the last relation into a Taylor series expansion leads to $$\frac{\Delta n_{Cl}(P_2)}{\Delta n_{Cl}(P_1)} \cong \frac{n_H(P_2)}{n_H(P_1)} \left[1 + \frac{E_1^A}{kT_1} \frac{T_2 - \alpha T_1}{T_2} + \frac{1}{2}\left(\frac{E_1^A}{kT_1} \frac{T_2 - \alpha T_1}{T_2}\right)^2 + \ldots\right].$$

The ratio, $$k_1 \equiv \frac{n_H(P_2)}{n_H(P_1)},$$

is always larger than unity, assuming a monotonic increase in hydrogen radicals with plasma power, e.g., $k_1 \geq 1$. Neglecting higher orders in a sum of infinite series, leaving only the first two members, $$1 + \frac{E_1^A}{kT_1} \frac{T_2 - \alpha T_1}{T_2} + \ldots,$$

we can see that $$\frac{T_2 - \alpha T_1}{T_2} \geq 0 \text{ (always)}$$

for any values of ($0 < \alpha \leq 1$), and therefore $$\frac{E_1^A}{kT_1} > 0.$$

From the last estimates we can achieve $$\frac{\Delta n_{Cl}(P_2)}{\Delta n_{Cl}(P_1)} \cong k_1 \binom{\text{where}}{k_1 \geq 1} \left[1 + \left\{\begin{array}{c}\text{positive}\\\text{number}\end{array}\right\}\right],$$

that there is always larger amount of chlorine released by hydrogen radicals in the same time interval at higher power, e.g., $\Delta n_{Cl}(P_2) \geq \Delta n_{Cl}(P_1)$.

Further yet, for instance, according to another explanation, plasma interaction with the substrate surface can have an effect on the effective surface temperature of the substrate due to ion bombardment. Increased plasma power generates a higher $V_{pp}$ (peak-to-peak voltage) on the electrode (such as an electrode in the upper assembly 30, or 130), which can cause a higher energy for ions incident on the substrate. Higher energy collisions with the substrate surface can generate a higher effective surface temperature and accelerates surface reactions. With time, local temperature is increased, thus saturation occurs sooner.

Figure 5:
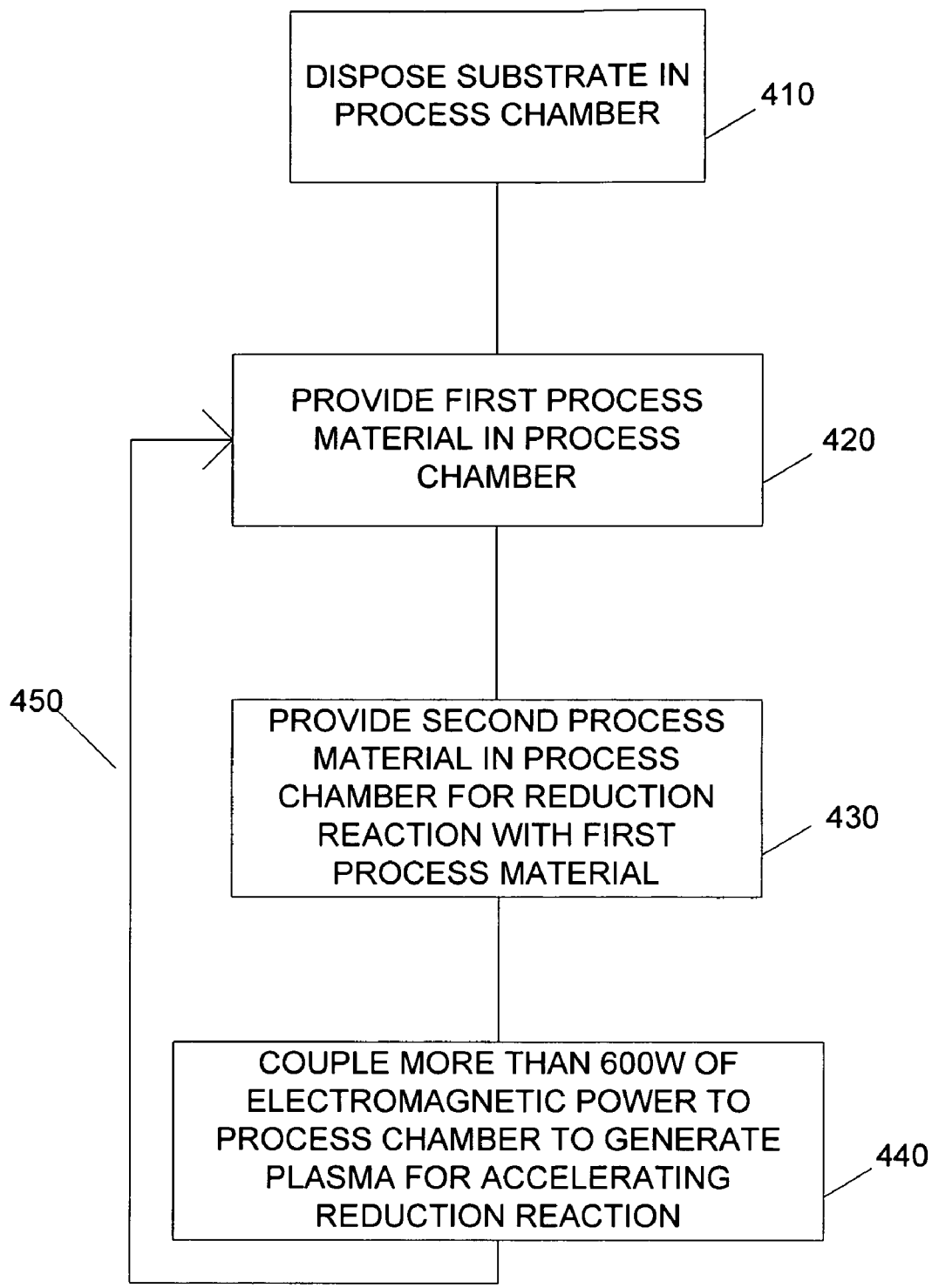
FIG. 5 shows a process flow diagram of an ALD process in accordance with an embodiment of the present invention.

FIG. 5 shows a process flow diagram of an ALD process in accordance with an embodiment of the present invention. The process of FIG. 5 may be performed by the processing system of FIGS. 1A, 1B, or 2A, 2B, or any other suitable processing system. As seen in FIG. 5, the process begins when a substrate, such as a semiconductor substrate, is inserted in a process chamber in step 410. For example, the substrate may be electrostatically clamped to a substrate holder such as the holder 25 or 125 described with respect to the systems of FIGS. 1A, 1B, and FIGS. 2A, 2B. In step 420, the first process material is provided into the process chamber for depositing on the substrate. The first process material can be a chemically volatile but thermally stable material that can be deposited on the substrate surface in a self-limiting manner. The nature of such deposition depends on the composition of the first process material and the substrate being processed. For example, the first process material can be absorbed on the substrate surface.

In step 430, the second process material is provided in the process chamber to provide a reduction reaction with the deposited first process material in order to form a desired film on the substrate surface. As would be understood by one of ordinary skill in the art, the first and second process materials are selected in accordance with a desired film to be deposited on the substrate. For example, first and second process materials for depositing a tantalum-containing film may include any combination of the tantalum deposition materials discussed above and the reducing agents discussed above.

In one example, when depositing tantalum (Ta), tantalum nitride, or tantalum carbonitride, the first process material can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, and the second process material can include $H_2$, $NH_3$, $N_2$ and $H_2$, $N_2H_4$, $NH(CH_3)_2$, or $N_2H_3CH_3$.

In another example, when depositing titanium (Ti), titanium nitride, or titanium carbonitride, the first process material can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and the second process material can include $H_2$, $NH_3$, $N_2$ and $H_2$, $N_2H_4$, $NH(CH_3)_2$, or $N_2H_3CH_3$.

As another example, when depositing tungsten (W), tungsten nitride, or tungsten carbonitride, the first process material can include $WF_6$, or $W(CO)_6$, and the second process material can include $H_2$, $NH_3$, $N_2$ and $H_2$, $N_2H_4$, $NH(CH_3)_2$, or $N_2H_3CH_3$.

In another example, when depositing molybdenum (Mo), the first process material can include molybdenum hexafluoride ($MoF_6$), and the second process material can include $H_2$.

When depositing copper, the first process material can include organometallic compounds, such as Cu(TMVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The second process material can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example, when depositing $ZrO_2$, the first process material can include $Zr(NO_3)_4$, or $ZrCl_4$, and the second process material can include $H_2O$.

When depositing $HfO_2$, the first process material can include $Hf(OBu^t)_4$, $Hf(NO_3)_4$, or $HfCl_4$, and the second process material can include $H_2O$. In another example, when depositing hafnium (Hf), the first process material can include $HfCl_4$, and the second process material can include $H_2$.

In still another example, when depositing niobium (Nb), the first process material can include niobium pentachloride ($NbCl_5$), and the second process material can include $H_2$.

In another example, when depositing zinc (Zn), the first process material can include zinc dichloride ($ZnCl_2$), and the second process material can include $H_2$.

In another example, when depositing $SiO_2$, the first process material can include $Si(OC_2H_5)_4$, $SiH_2Cl_2$, $SiCl_4$, or $Si(NO_3)_4$, and the second process material can include $H_2O$ or $O_2$. In another example, when depositing silicon nitride, the first process material can include $SiCl_4$, or $SiH_2Cl_2$, and the second process material can include $NH_3$, or $N_2$ and $H_2$. In another example, when depositing TiN, the first process material can include titanium nitrate ($Ti(NO_3)$), and the second process material can include $NH_3$.

In another example, when depositing aluminum, the first process material can include aluminum chloride ($Al_2Cl_6$), or trimethylaluminum ($Al(CH_3)_3$), and the second process material can include $H_2$. When depositing aluminum nitride, the first process material can include aluminum trichloride, or trimethylaluminum, and the second process material can include $NH_3$, or $N_2$ and $H_2$. In another example, when depositing aluminum oxide, the first process material can include aluminum chloride, or trimethylaluminum, and the second process material can include $H_2O$, or $O_2$ and $H_2$.

In another example, when depositing GaN, the first process material can include gallium nitrate ($Ga(NO_3)_3$), or trimethylgallium ($Ga(CH_3)_3$), and the second process material can include $NH_3$.

Referring again to FIG. 5, in step 440, more than 600 W of electromagnetic power is coupled to the second process material in the process chamber in order to facilitate a reduction reaction on the substrate. As used herein "electromagnetic power" means RF power, microwave frequency power, light wave power, or any known power suitable for generating a plasma in a plasma process chamber. In the embodiment of FIGS. 1A, 1B, and 2A, 2B, the electromagnetic power can be coupled to the process chamber using one or more of the electrodes in the upper assembly and the substrate electrode. The coupling of high power to the second process material (i.e., reducing agent) in step 440 heats the reducing agent, thus causing ionization and/or dissociation of the reducing agent in order to form a radical that chemically reacts with the first precursor adsorbed on the substrate to accelerate the reduction process and reduce impurities within the deposited film as described above. In an embodiment, the power ranges from approximately 600 W to approximately 1500 W. In another embodiment, the power is approximately 1000 W, however, the actual plasma processing power may vary depending on factors such as the composition and characteristics of the film to be deposited. Suitable high power levels that enable ALD deposition of a film at improved deposition speeds and with reduced impurities in accordance with an embodiment of the invention can be determined by direct experimentation and/or design of experiments (DOE). Other adjustable process parameters such as substrate temperature, process pressure, type of process gas and relative gas flows can also be determined by direct experimentation and/or design of experiments (DOE).

The reduction reaction completed by step 440 results in a thin layer of the desired film being deposited on the substrate surface. For example, the reduction reaction may result in a thin layer of a barrier layer, a seed layer, an adhesion layer, a gate layer, a metal layer, a metal oxide layer, a metal nitride layer, or a dielectric layer being deposited on a feature of the substrate. Once the reduction reaction takes place, steps 420-440 of FIG. 5 can be repeated to deposit additional layers of material on the substrate until the desired thickness is achieved, as shown by process flow arrow 450 of FIG. 5.

While not shown in FIG. 5, in an embodiment, a purge gas is introduced to the process chamber between the steps for introducing the first process material and the second process material, as discussed with respect to FIG. 3. That is, the purge gas can be introduced after the first process material and before the second process material, or the purge gas can be introduced after the second process material and before the first process material of a subsequent cycle. The purge gas allows the first process material to be expelled from the process chamber by vacuum pumping prior to introduction of the second process material. Similarly, where multiple ALD cycles are executed, a purge gas can be introduced after the reduction reaction takes place to expel the second process material before introduction of the first process material. This purging ensures that the reduction reaction occurs primarily at the adsorbed layer of the first process material on the substrate, rather than in the process chamber atmosphere prior to being deposited.

In addition to the effect of a high plasma power level on the deposition of ALD films, the present inventors have considered the potential effect of relatively low plasma power on the deposition of ALD films. In doing so, the present inventors have determined that a low power plasma may provide for the removal of residual contaminants in the process chamber and the substrate, prior to the actual reduction reaction taking place. Specifically, introduction of the first process material (the film precursor) typically results in this material being adsorbed on the process chamber components, such as the chamber walls, as well as on the substrate. Further, byproducts of previous reduction reactions may exist on the process chamber components. For example, when depositing a tantalum-containing film as described above, residual chlorine from the first process material is typically present on the substrate and chamber components.

During the ALD process, and in particular the plasma-enhanced reduction reaction, materials on the chamber components can be sputtered and can contaminate the deposited film, which can result in a film having poor properties. The present inventors have recognized that although a higher plasma power can lead to a greater deposition rate, reduced film resistivity, and reduced chlorine content in the film (for a chlorine-containing precursor), it can also lead to the appearance of other contaminants in the film arising from the sputtering of process chamber components by large ionized contaminants, such as ionized chlorine (as opposed to the smaller hydrogen ions in a hydrogen plasma reduction step). For instance, when $TaCl_5$ is reduced on the substrate surface using a hydrogen plasma, HCl evolves from the surface, which in the presence of the plasma, dissociates to form ionized chlorine, etc., which is a large ion and capable of sputtering process chamber components. As the plasma power is increased, the sheath voltage adjacent process chamber components can exceed the sputtering threshold for the material composition of the process chamber component. For example, the electrode in the upper assembly 30, 130, as depicted in FIGS. 1A, 1B, 2A and 2B, can be fabricated from a corrosion resistant material, such as nickel (having a sputtering threshold voltage of approximately 143 V) when using chlorine-containing materials. Thus, a low power plasma can effectively release the contaminants from the substrate and the process chamber wall such that they can be expelled from the chamber by vacuum pumping prior to the application of relatively high power that, while facilitating a higher rate reduction reaction on the substrate surface, could sputter the chamber components.

Figure 6:
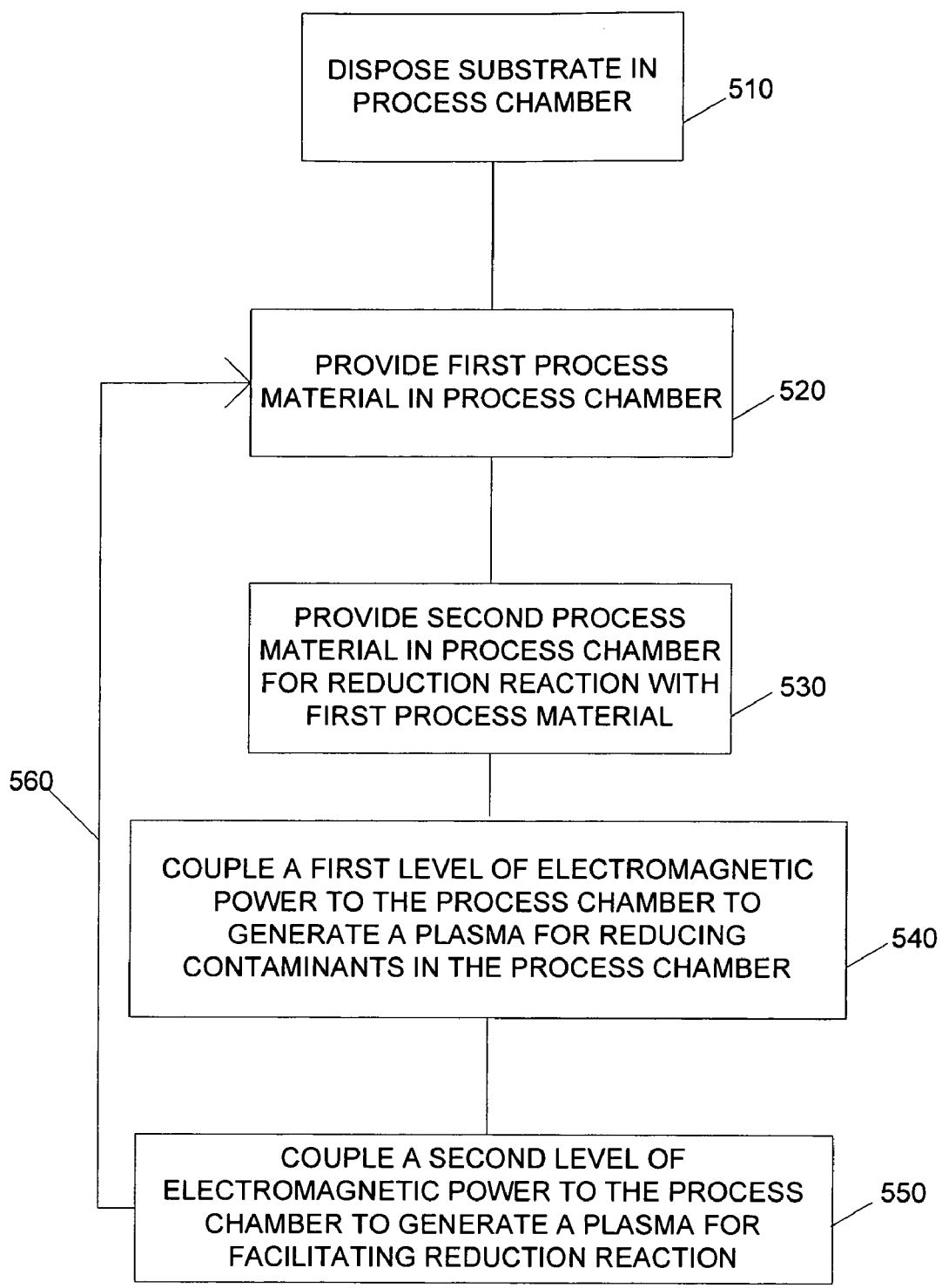
FIG. 6 shows a process flow diagram of an ALD process in accordance with another embodiment of the present invention.

Based on the above recognition of the benefits of using low and high power plasmas, the present inventors discovered that varying the plasma power level during an ALD process can provide the dual advantage of reduced contamination of the ALD film as well as improved deposition rate of the film. FIG. 6 shows a process flow diagram of an ALD process in accordance with an embodiment of the present invention. The process of FIG. 6 may be performed by the processing system of FIGS. 1A, 1B, or 2A, 2B, or any other suitable processing system. As seen in FIG. 6, the process begins when a substrate, such as a semiconductor substrate, is inserted in a process chamber in step 510. In step 520, the first process material is provided into the process chamber in order to adsorb to the substrate surface. In step 530, the second process material is provided in the process chamber to provide a reduction reaction with the deposited first process material in order to form a desired film on the substrate surface as discussed above. As would be understood by one of ordinary skill in the art, the first and second process materials are selected in accordance with a desired film to be deposited on the substrate. For example, any of the combinations of first and second process materials described herein may be applied to the process of FIG. 6.

In step 540 of FIG. 6, a first level of electromagnetic power is coupled to the process chamber in order to generate a plasma for reducing contaminants in the process chamber. The first level of plasma power may be as low as the threshold level for generating plasma, and is preferably not higher than a level determined to disrupt or damage the substrate including any deposited films thereon. As would be understood by one of ordinary skill in the art, the first power level will depend on the material being deposited, as well as when the first level of power is applied during the ALD process. The first level of power can be coupled to the process chamber during providing the first process material, providing the second process material and/or providing a purge gas. As discussed above, the first level of power can release contaminants from the process chamber and/or substrate, while not exceeding the sputtering threshold for the process chamber components. Thus, in an embodiment, the first level of power is applied to the process chamber while the second process material is introduced to the process chamber. Alternatively, in another embodiment, the first level of power is applied to the process chamber to generate a cleaning plasma during a purge gas step where the released contaminants can be efficiently vacuum pumped from the process chamber. While not shown in FIG. 6, in an embodiment, a purge gas is introduced to the process chamber between the steps for introducing the first and second process materials and/or after the reduction reaction as discussed with respect to FIG. 3. In this regard, the first and/or second levels of plasma power can be applied during the introduction of the purge gas.

In step 550, a second level of power higher than the first level is coupled to the process chamber to generate a plasma for facilitating a reduction reaction on the substrate surface. Thus, the second level of power should be coupled to the process chamber during introduction of the second process material, but may also be coupled at other times during the ALD process. As with the first power level, the second level of power is largely dependent on the first and second process materials, as well as the time in the ALD process that the second power level is applied. In an embodiment, the second level of power is above 600 W to accelerate the reduction reaction and reduce impurities as described above. However, in the embodiments of FIG. 6, it is sufficient that the second level of power generates a plasma for facilitating the reduction reaction. Once the reduction reaction takes place, steps 520 to 550 of FIG. 6 can be repeated to deposit additional layers of material on the substrate until the desired thickness is achieved, as shown by process flow arrow 560 of FIG. 6.

Figure 7A:
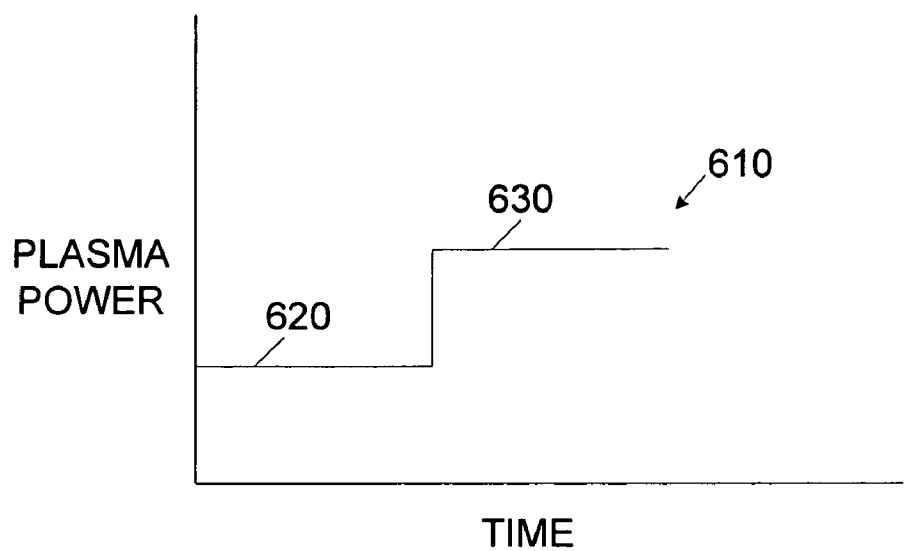
FIGS. 7A and 7B show power graphs depicting the power level variation of a power coupled to the processing chamber to generate cleaning and reduction reaction plasmas in accordance with embodiments of the present invention.
Figure 7B:
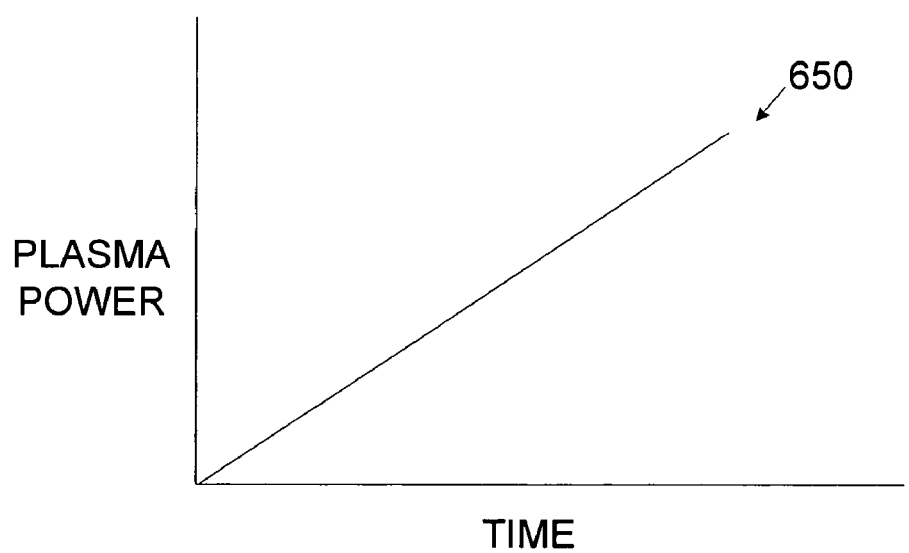

FIGS. 7A and 7B show power graphs depicting the power level variation of power coupled to the process chamber to generate cleaning and reduction reaction plasmas in accordance with embodiments of the present invention. As shown by power curve 610 in FIG. 7A, the plasma power may be applied to the process chamber in a plurality of discrete levels (two shown). Specifically, the first power level 620 may be applied to remove contaminants from the substrate and the process chamber components so that such contaminants can be expelled from the process chamber as described above. As also noted above, the first power level may be as low as the threshold level for plasma generation, or as high as 600 W, and the second power level 630 is preferably above 600 W and more preferably about 1000 W or greater in order to accelerate the reduction process and reduce contaminants. In one example, the first power level is not higher than a sputtering threshold for chamber components within the chamber as discussed above. As seen in FIG. 7B, the plasma power level may be applied to the process chamber in a continuously changing fashion represented by the power curve 650.

As would be understood by one of ordinary skill in the art, the power curves of FIGS. 7A and 7B are exemplary, and the varying power may depend on the composition and characteristic of the film to be deposited by the ALD process. For example, the plasma power of FIG. 7A can include more than two (2) discrete power levels, and the plasma power of FIG. 7B may change in a non-linear fashion. Moreover, a combination of stepped and ramped power can be used to provide the first and second power levels of steps 540 and 550 of FIG. 6. Still further, suitable high power levels that enable ALD deposition of a film at improved deposition speeds and with reduced impurities in accordance with an embodiment of the invention can be determined by direct experimentation and/or design of experiments (DOE). Other adjustable process parameters such as substrate temperature, process pressure, type of process gas and relative gas flows can also be determined by direct experimentation and/or design of experiments (DOE).

As noted above, varying plasma power such as that shown in the curves 610 and 650 of FIGS. 7A and 7B may be applied to the process chamber during introduction of the second process material alone, or throughout the entire ALD cycle as long as a relatively higher power level is applied to the second process material to facilitate a reduction reaction. For example, where varying power is applied only during introduction of the second process material, initial low power levels may release impurities from the substrate and the process chamber walls, while not providing sufficient plasma density to substantially facilitate the reduction reaction at the substrate surface. As the power increases in a step as shown in FIG. 7A, or a continuous change as shown in FIG. 7B, the plasma radicals facilitate the reduction reaction in an environment having been made cleaner by the initial low power.

In another embodiment, the varying power can occur during other steps in the ALD cycle and serve dual functions. For example, a first power level can be applied during introduction of the first process material to assist in adsorption of the first material to the substrate surface, while also operating to release contaminants from the process chamber. A second power level may also be applied during introduction of the second process material and/or a purge gas step to reduce contaminants. Ultimately, the plasma power level is increased to above 600 W during introduction of the second process material in order to accelerate the reduction process and reduce contamination in the deposited layer as discussed above.

As discussed above, in one embodiment of the present invention an inert purge gas can be introduced into the process chamber during the ALD process. Specifically, as shown in FIG. 3, the purge gas may be introduced into the process chamber between introduction of the first and second process materials, and further after introduction of the second process material at the end of the ALD cycle. This inert purge gas serves the function of separating the first and second process materials to reduce chemical reactions in the chamber environment prior to deposition on the substrate surface, and further to assist in expelling contaminants removed from the process chamber walls and/or substrate surface. In another embodiment of the present invention, a reactive gas purge can be performed to further assist in removing contaminants.

Figure 8:
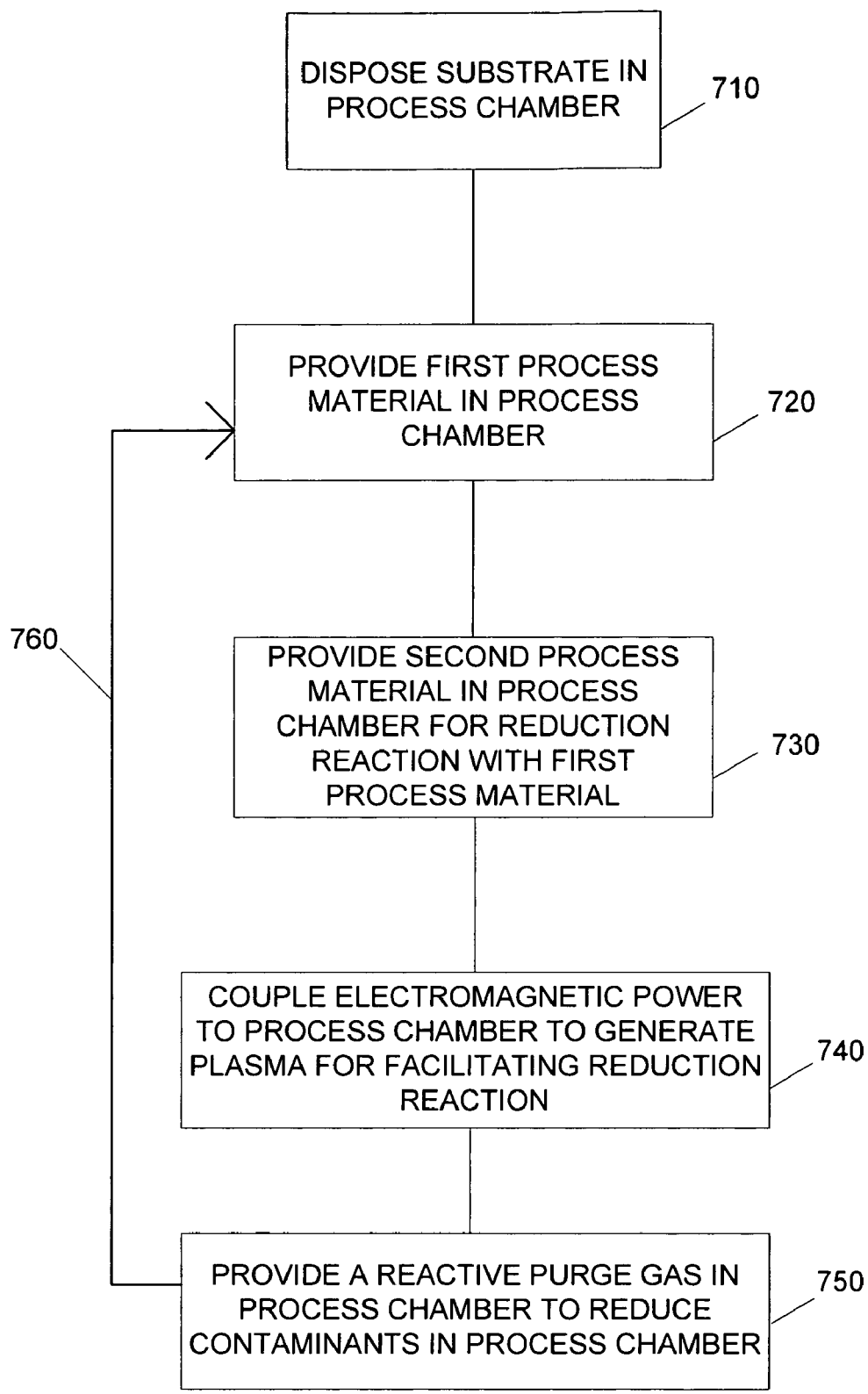
FIG. 8 shows a process flow diagram of an ALD process in accordance with an embodiment of the present invention.

FIG. 8 shows a process flow diagram of an ALD process in accordance with an embodiment of the present invention. The process of FIG. 8 may be performed by the processing system of FIGS. 1A, 1B, or 2A, 2B, or any other suitable processing system. As seen in FIG. 8, the process begins when a substrate is inserted in a process chamber in step 710. In step 720, the first process material is provided into the process chamber in order to adsorb to the substrate surface as discussed above. In step 730, the second process material is provided in the process chamber to provide a reduction reaction with the deposited first process material in order to form a desired film on the substrate surface. As discussed with other embodiments, the first and second process materials are selected in accordance with a desired film to be deposited on the substrate and any of the combinations of first and second process materials described herein may be applied to the process of FIG. 8.

In step 740, a plasma is generated in the process chamber by coupling electromagnetic power to the process chamber during introduction of the second processing material. The power level coupled to the chamber in step 740 is preferably above 600 W, and, for example, can be about 1000 W in order to accelerate the reduction reaction and reduce contaminants as described above. Moreover, a varying power may be coupled to the process chamber in order to provide further reduction of contaminants as described in FIGS. 6 and 7 above. However, in the embodiment of FIG. 8, it is sufficient that a power necessary to generate a plasma is provided in step 740 in order to assist in a reduction reaction of the substrate.

In step 750, a reactive cleaning gas is introduced into the process chamber. Unlike the inert purge gas steps discussed with respect to FIG. 3, the reactive cleaning gas chemically reacts with contaminants on the process chamber walls and/or the substrate surface to assist in removing such impurities from the process chamber. As would be understood by one of ordinary skill in the art, the composition of the reactive gas depends largely on the ALD process and, in particular, the contaminants to be removed from the process chamber. That is, in step 750, a reactive gas is selected to react with the contaminants to be removed from the process chamber. Returning again to the example of depositing a tantalum film, using tantalum pentachloride as the first process material and hydrogen for the second process material (i.e., reduction reaction), chlorine contaminants may reside on the processing walls and within the deposited film itself. To remove these chlorine contaminants, ammonia ($NH_3$) can be introduced to chemically react with the chlorine contaminants and release them from the walls and/or substrate, so that the contaminants can be expelled from the chamber by vacuum pumping. Once the purge step 750 is completed, the process steps 720 to 750 can be repeated to obtain a desired thickness as shown by arrow 760.

In another embodiment, the process chamber walls may be heated in order to facilitate a chemical reaction to remove the contaminants. For example, when reducing chlorine contaminants as described above, the chamber walls are heated to at least 80 degrees C. In some instances, a plasma may also be generated to facilitate the chemical cleaning reaction. However, such plasma should not cause an undesirable reaction at the substrate surface. Once the purge step 750 is completed, the process steps 720 to 750 can be repeated to obtain a desired film thickness as shown by process arrow 760. While FIG. 8 lists the reactive gas purge step 750 after the reduction reaction takes place in step 740, the reactive gas purge may be done between introduction of the first and second process materials as shown in FIG. 3. However, unlike the inert gas purge steps shown in FIG. 3, the reactive gas chemically reacts with contaminants on the walls of the process chamber and/or substrate to assist in removal of the contaminants from the process chamber. Due to the insertion of the additional step, the act of expelling the reactive process gas and contaminants may include only a single reactive purge step per ALD cycle as shown in FIG. 8. Alternatively, the reactive purge gas step may be done only intermittently, such as during every other cycle, or every $3^{rd}$ cycle. In this regard, the reacting gas purge step may be done in combination with inert purge steps as described in FIG. 3.

In another embodiment of the present invention, contaminants that affect the ALD process can be reduced by attracting the contaminants away from a substrate region to a peripheral region of the process chamber. Specifically, generation of a plasma within the substrate region ionizes contaminants that can have a detrimental effect on the film deposited on the substrate. For example, when depositing a tantalum-containing material as discussed above, chlorine contaminants in the process chamber are ionized by application of plasma power. As such, the present inventors discovered that generating a separate plasma in a peripheral region of the process chamber can create a potential difference that induces a transport of electrically charged material which removes ionized contaminants from the substrate region to a peripheral region of the process chamber. The attracted contaminants are then either adhered to the process chamber walls or expelled from the process chamber by vacuum pumping, thereby reducing the effects of the contaminants on the deposited film.

Figure 9A:
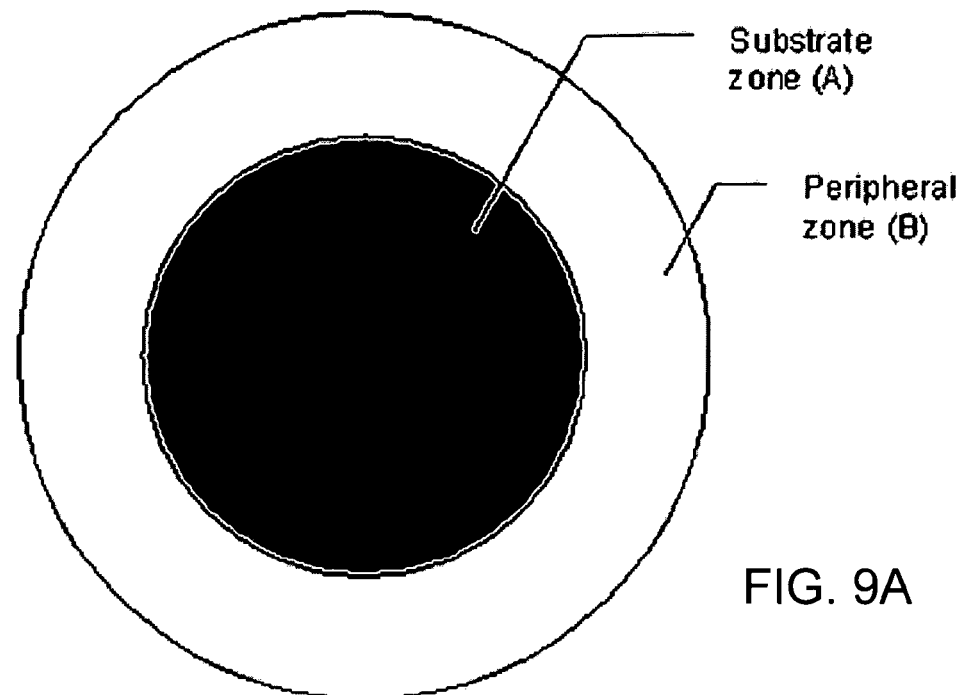
FIGS. 9A-C illustrate a substrate zone and a peripheral zone in a PEALD process chamber, and two timing sequences for plasma in the substrate zone and plasma in the peripheral zone according to an embodiment of the present invention.

As described above, when depositing a tantalum film using tantalum pentachloride as a film precursor (first process material) and hydrogen as a reducing agent (second process material), HCl evolves from the film as a product of the surface reduction reaction. HCl in the presence of the plasma is dissociated, and chlorine ions ($Cl^-$) can be formed. In an electronegative (Cl) plasma, the decay of the electronegative plasma (typical for chlorine) following the shutdown of plasma power is such that the electrons decay quickly due to their high mobility. In a weakly electronegative plasma the negative ions will gradually decay within the substrate zone (A) (see FIG. 9A) and the substrate zone (A) will be maintained at electropositive charge for a short period of time (microseconds) by remaining positive ions. In a stronger electronegative plasma, the negative ions are decaying over a longer time scale relative to the electrons due to the diffusive character of their motion (recombination at higher pressures) to the closest surfaces. Since in the substrate zone (A) the closest surfaces are the substrate surface (25 or 125 in FIGS. 1A, 1B, 2A, or 2B) or the electrode in the upper assembly (30 or 130 in FIGS. 1A, 1B, 2A or 2B), the ions reach these surfaces in a shorter time than they would reach the sidewalls of the process chamber.

In other words, during the plasma decay, there are two stages: (1) In the first stage, the flux of negative ions to the wall is absent and the electron density decays sharply with time, whereby almost all electrons escape within a finite time from the discharge volume where an ion-ion (electron-free) plasma is formed, and (2) In the second stage, this plasma decays by an ion-ion ambipolar diffusion mechanism. To provide transport of the ions from the substrate zone (A) towards a peripheral zone (B) (see FIG. 9A), such as the walls of the process chamber (and eventually to a pumping orifice), two plasma regions that interface each other can be produced in accordance with an embodiment of the present invention. The first plasma region substantially coincides with substrate zone (A), the second plasma region is surrounding the first plasma region and substantially coincides with the peripheral zone (B), hence, creating large interface surface.

Figure 9B:
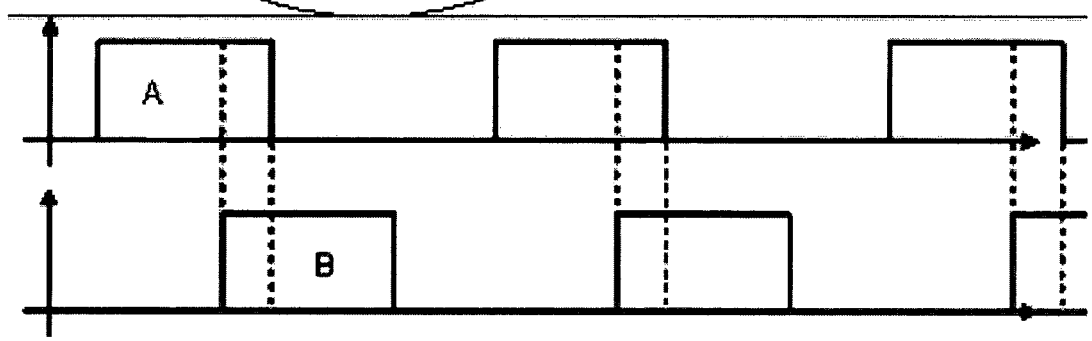
Figure 9C:
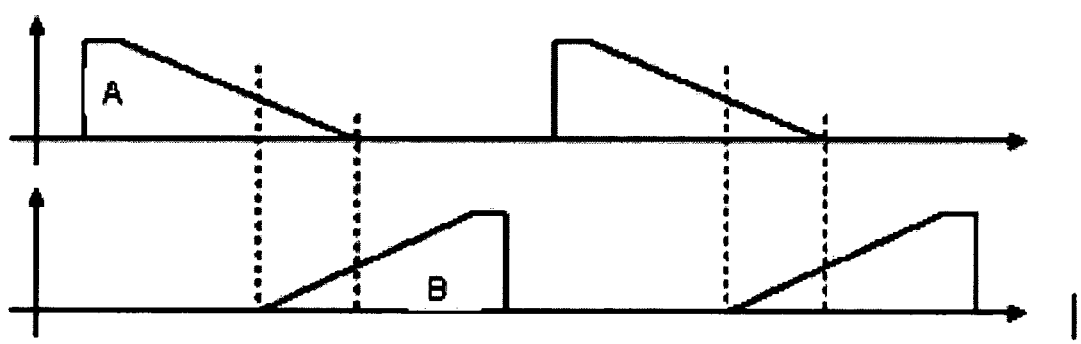

For example, both plasma regions can be powered by generating plasma in manner of an overlapping timing sequence. Physical adsorption of chlorine (more generally, reactive products) does not occur within substrate zone (A) when plasma is on in substrate zone (A). Before the turning the plasma off in the substrate zone (A), the plasma in the peripheral zone (B) is initiated. Once the plasma is initiated in the peripheral zone (B), the plasma in the substrate zone (A) is extinguished and ions from the substrate zone (A) are transported to peripheral zone (B), where there is higher probability to be pumped out. This cycling can be repeatedly applied to an electrode in the upper assembly 30 and electrode 30A in FIG. 1B, or to an electrode in the upper assembly 130 and electrode 130A in FIG. 2B, in the substrate zone (A) and the peripheral zone (B), respectively between the main process steps to transport residual contaminants out of substrate surface. For instance, FIGS. 9B and 9C illustrate two exemplary timing sequences.

As previously discussed, FIGS. 1B and 2B show deposition systems having an optional peripheral plasma electrode for generating a plasma to attract ionized contaminants to the peripheral zone (B) of the process chamber. Specifically, FIG. 1B shows an upper assembly 30 having a first electrode positioned to generate a processing plasma substantially in a region of the substrate 25, i.e., the substrate zone (A) of FIG. 9A. In addition, a peripheral electrode 30A is positioned around a periphery of the upper assembly 30, and it is configured to generate a secondary plasma in the peripheral zone (B) of FIG. 9B. Similarly, FIG. 2B shows an upper assembly 130 that generates a first plasma substantially in a region of the substrate, i.e., the substrate zone (A), as well as a peripheral electrode 130A positioned around a periphery of the upper assembly 130, and it is configured to generate a secondary plasma in the peripheral zone (B). As shown in FIGS. 1B and 2B, the peripheral electrodes 30A and 130A are positioned outside of a periphery of the substrate 25 and 125, respectively, in order to attract contaminants beyond an outer edge of the substrate. Further, the peripheral electrodes may include gas injection orifices coupled to a vacuum pumping system as will be further described below.

The first plasma region in substrate zone (A) can be formed by the plasma source utilized by PEALD process, such as upper assembly (electrode) 30 in FIG. 1A or upper assembly (electrode) 130 in FIG. 2A. The secondary plasma source is created substantially at the perimeter of the process chamber using, for instance, the peripheral electrode 30A or 130A depicted in FIGS. 1B and 2B, respectively. The peripheral electrode 30A and 130A can be as described above, or they may comprise a cylindrical electrode that mimics the process chamber wall, or they may comprise an annular planar electrode at the top, or bottom, or both of the process chamber (either single or two electrodes can be utilized). For instance, FIGS. 10A, 10B, 10C, and 10D illustrate electrode configurations for peripheral electrodes 30A and 130A.

Figure 10A:
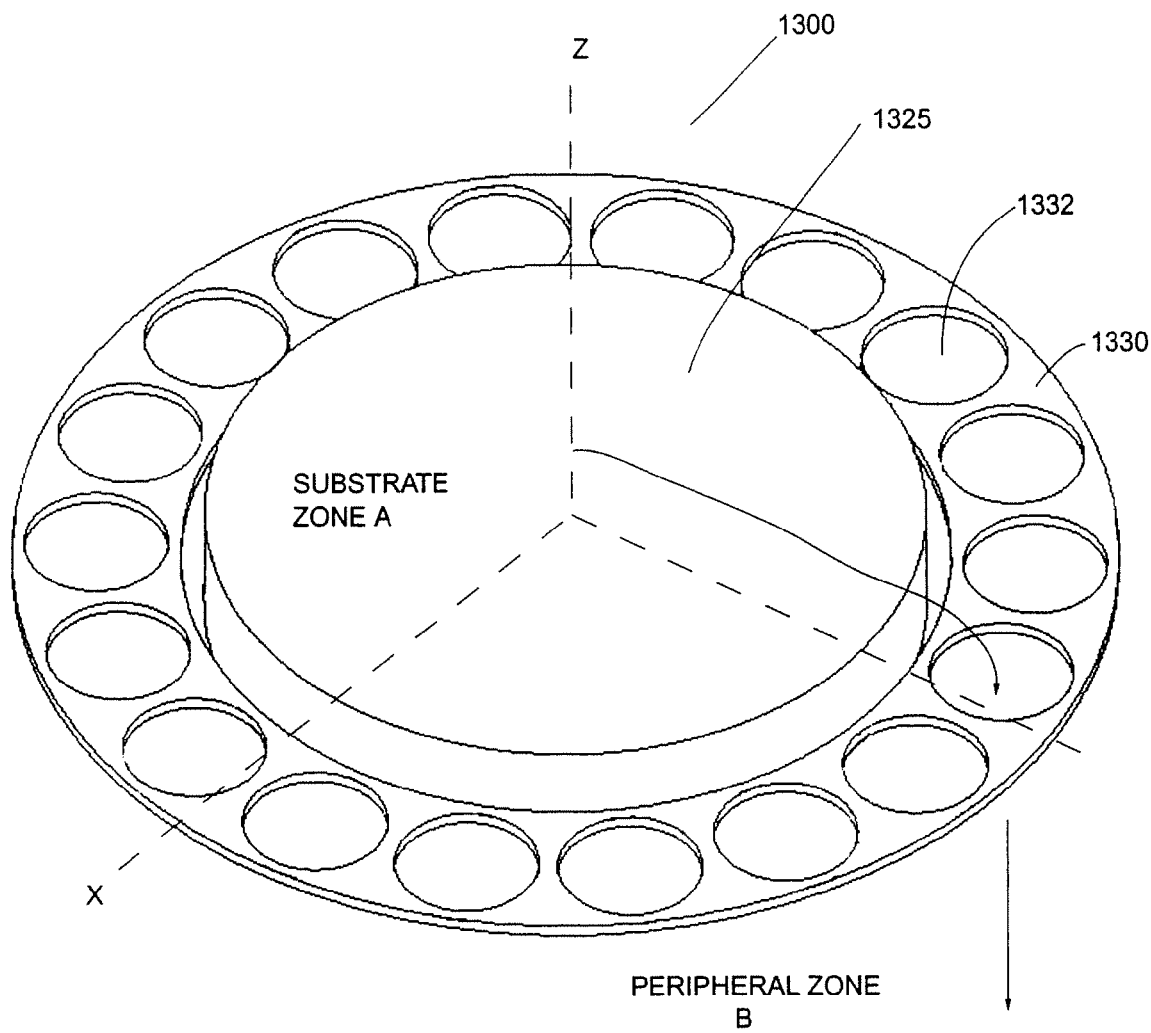
FIGS. 10A-10D depict peripheral electrode assemblies according to embodiments of the present invention.
Figure 10B:
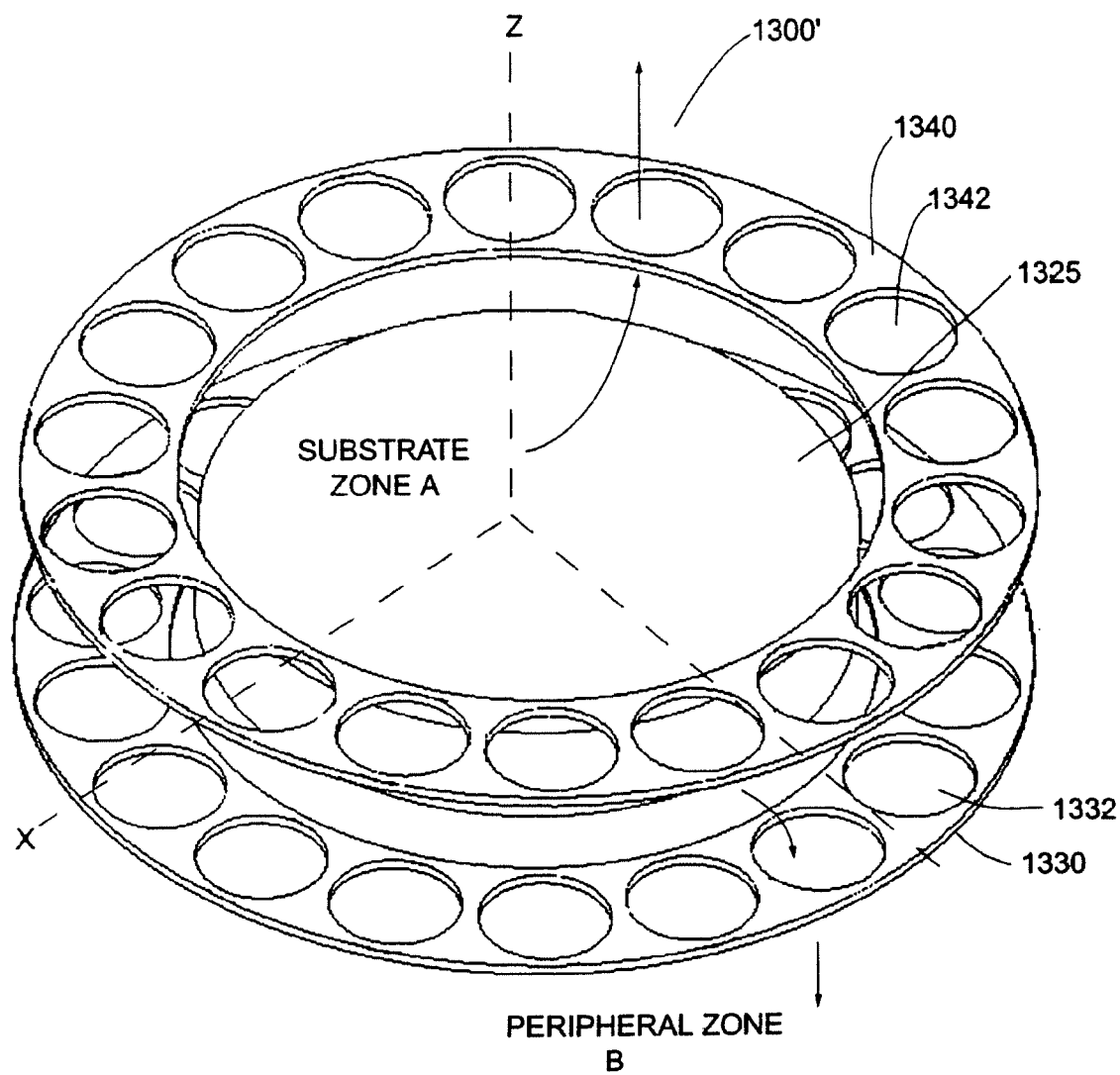
Figure 10C:
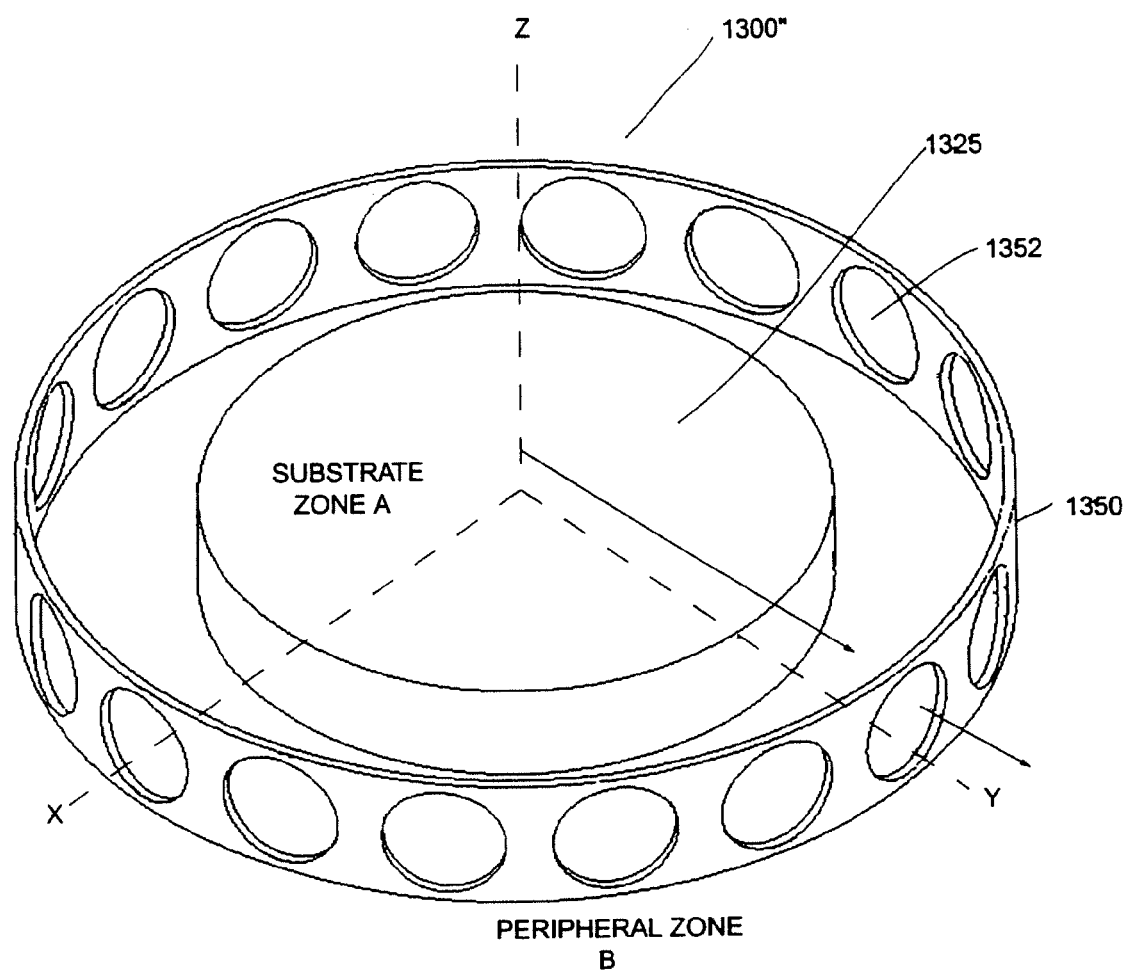
Figure 10D:
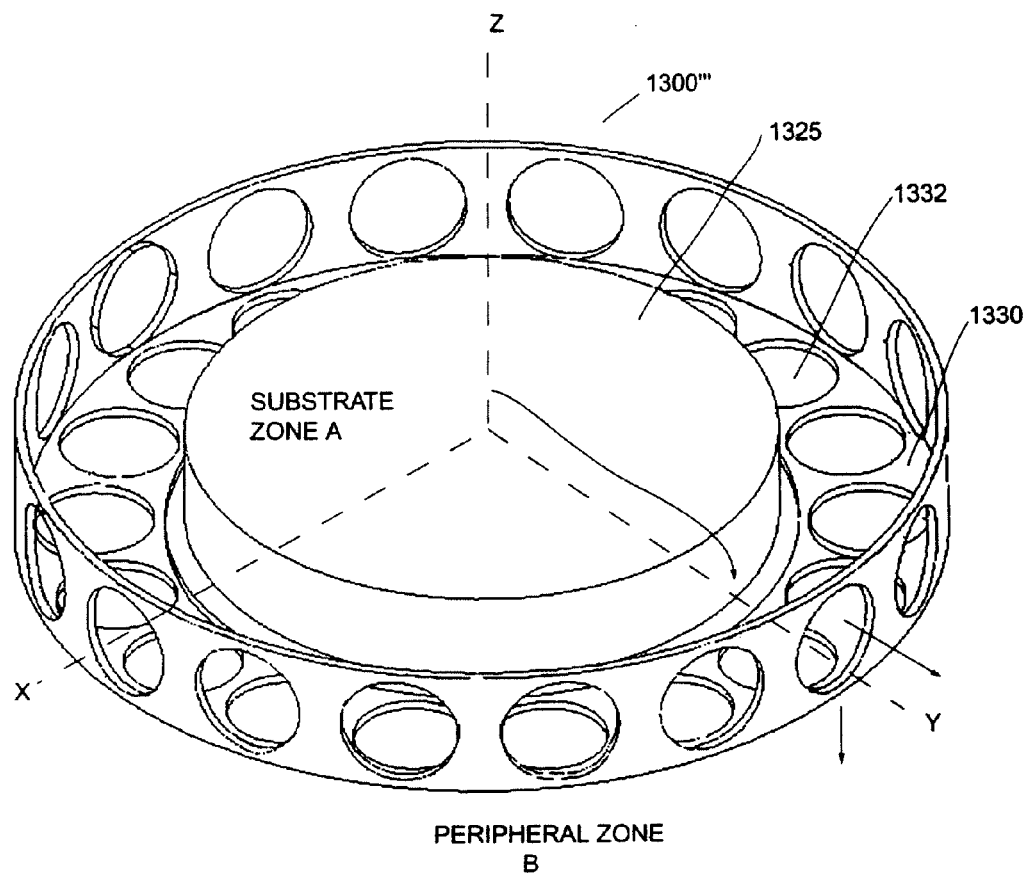

Dimensionally the secondary plasma electrode (30A, 130A) can coincide approximately with the process chamber dimensions, and have minimal dimensions consistent with the edge of the substrate. Because this electrode assists plasma transport from the substrate zone (A) to the peripheral zone (B), a sufficient cross-section for gas flow has to be provided so as to not restrict pumping speed. Examples of electrode geometry are shown in FIGS. 10A to 10D. As illustrated in FIG. 10A, a peripheral electrode assembly 1300 comprises a first electrode 1330 surrounding the peripheral edge of substrate 1325. The electrode comprises orifices 1332 configured to permit the passage of processing gases therethrough. In FIG. 10B, a peripheral electrode assembly 1300' comprising a second electrode 1340 with orifices 1342 is shown. In FIG. 10C, a peripheral electrode assembly 1300" comprising a third electrode 1350 with orifices 1352 is shown, and, in FIG. 10D, a peripheral electrode assembly 1300'" comprising the third electrode 1350 is shown in combination with the first electrode 1330.

Each electrode can be biased by an external power source, such as a radio frequency (RF) power generator through a matching network in a frequency range from 100 kHz to 100 MHz. A pulsed direct current (DC) signal (positive or negative polarity, depending upon the electropolarity of the residual gas) can be used, for example, during the operation of the first plasma source in substrate zone (A) (i.e., electrode 30, or 130 in FIGS. 1A and 2B, respectively) in order to assist a quasi-continuous removal of residual species from the substrate zone (A). The electrodes can be fabricated from a suitable metal which is non-corrosive in the reactive environment. For instance, during RF application, they can be coated by a suitable, highly chemically resistive ceramic material.

Alternatively, the secondary plasma source can include inductively coupled devices to supply electromagnetic power to the peripheral zone (B), such as those inductive devices described in for example, such as described in pending U.S. patent application Ser. No. 10/717,268, entitled "Plasma Processing System with Locally-Efficient Inductive Plasma Coupling".

Figure 11A:
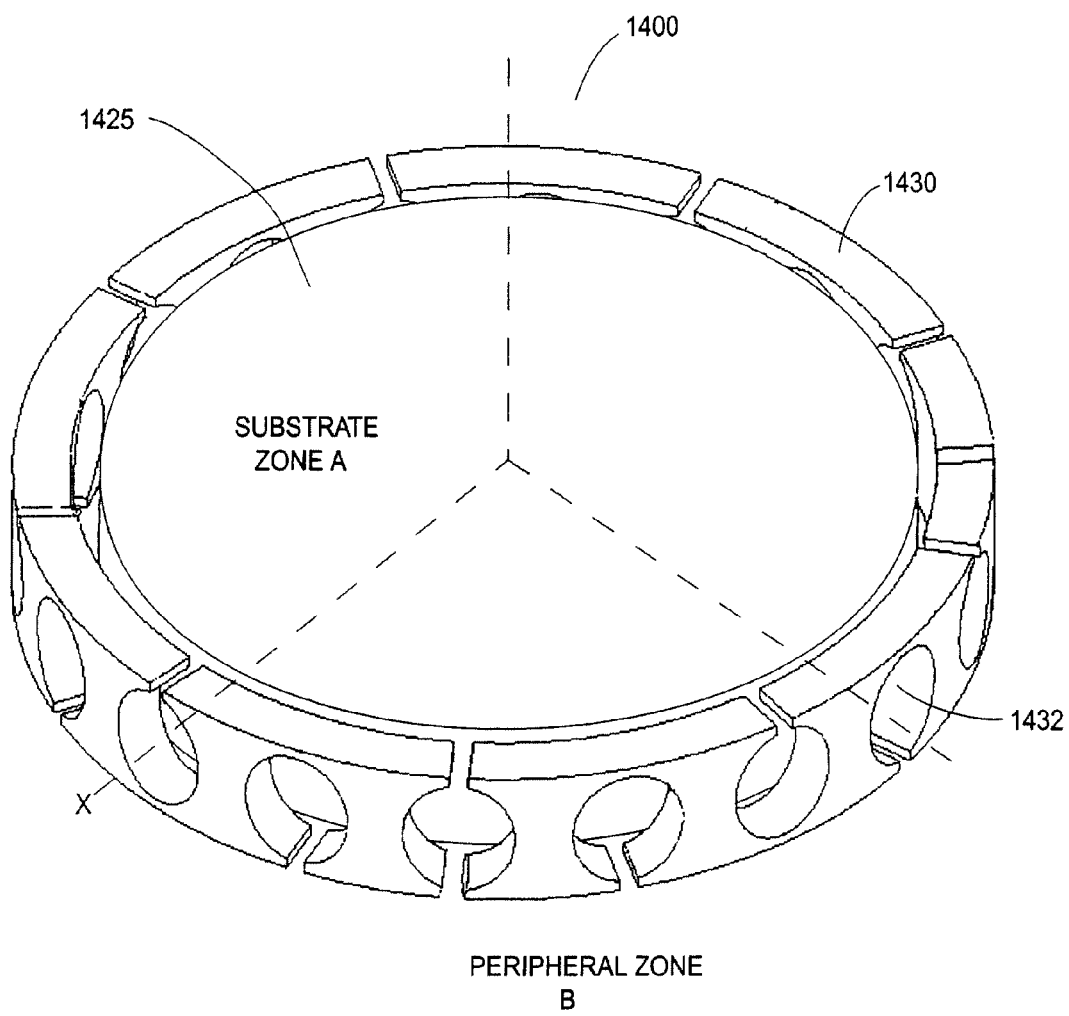
FIGS. 11A-11D depict peripheral inductive electrode assemblies according to embodiments of the present invention.
Figure 11B:
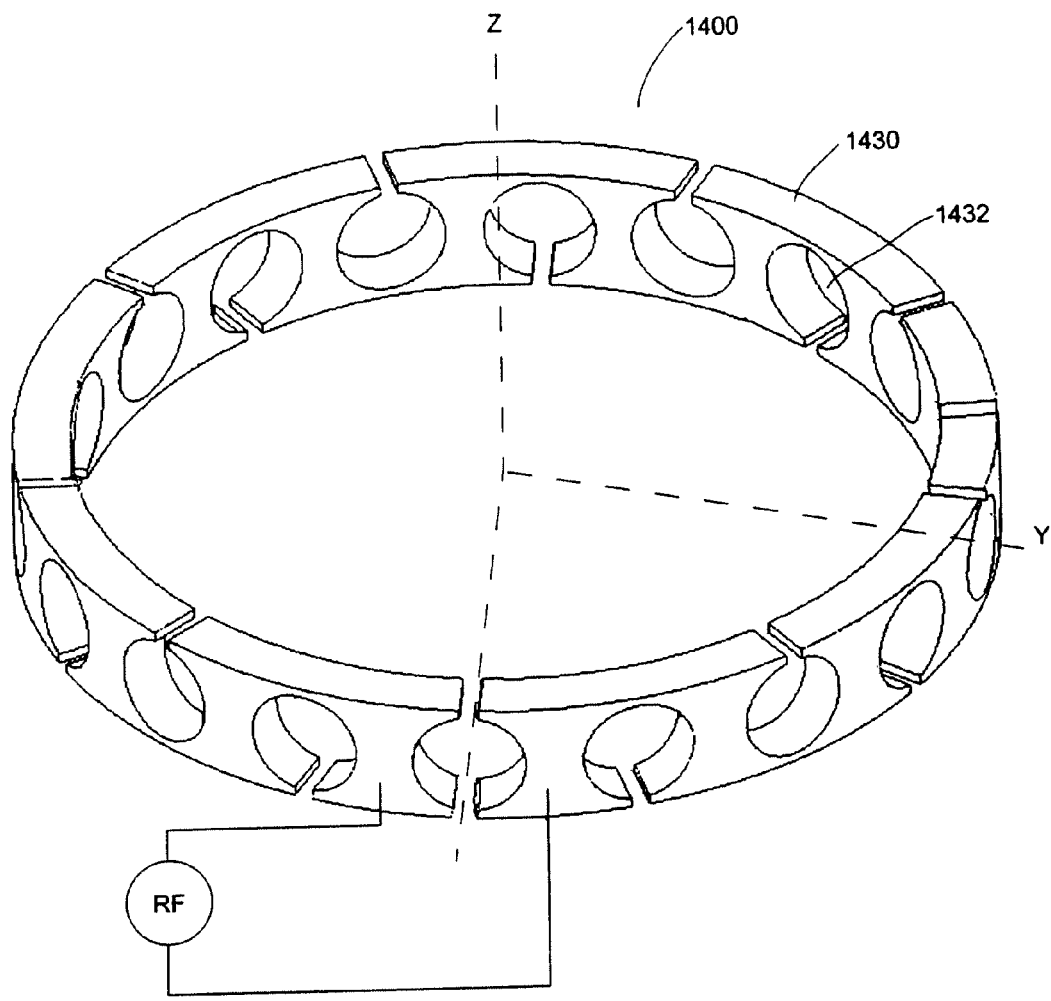
Figure 11C:
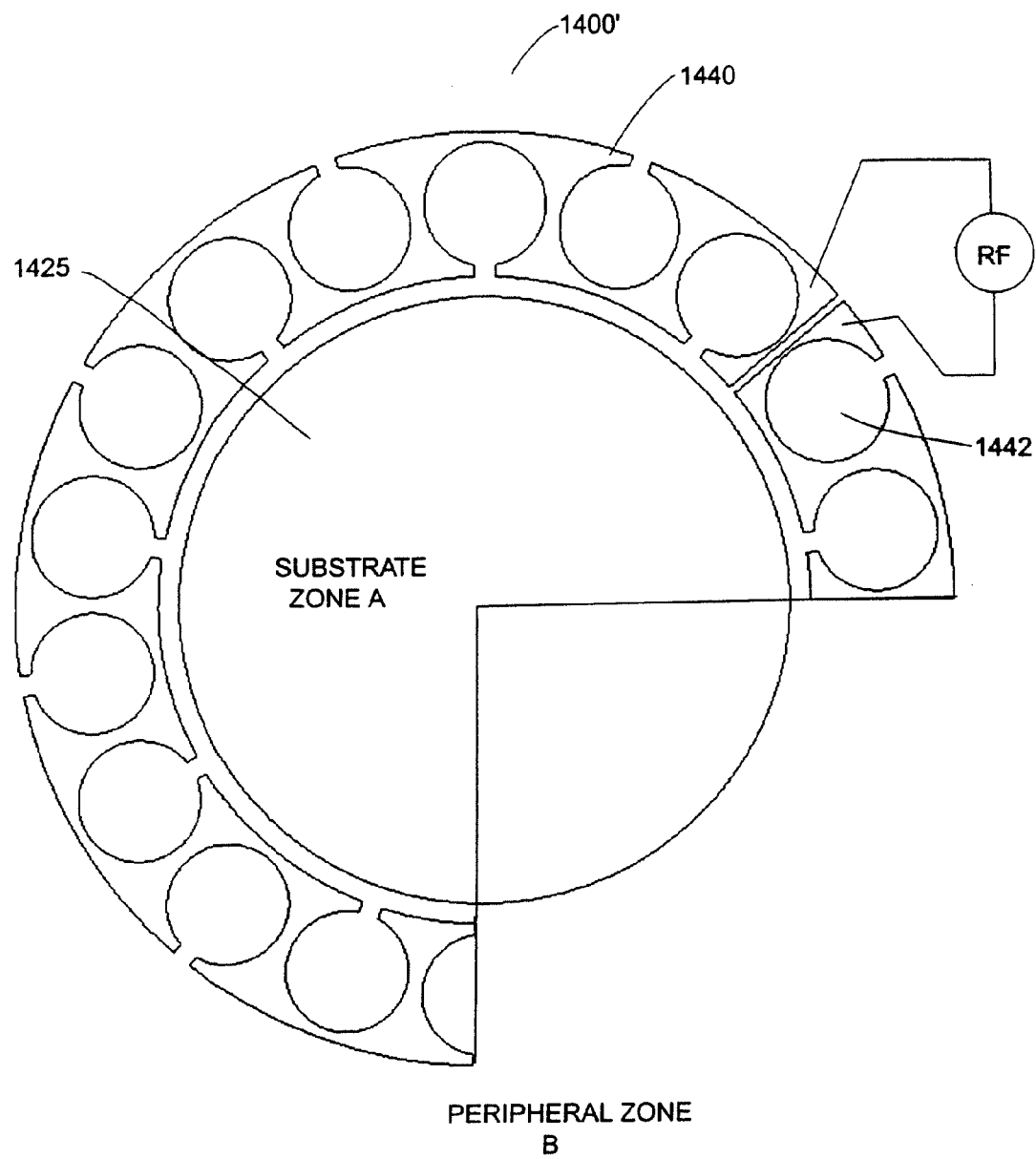
Figure 11D:
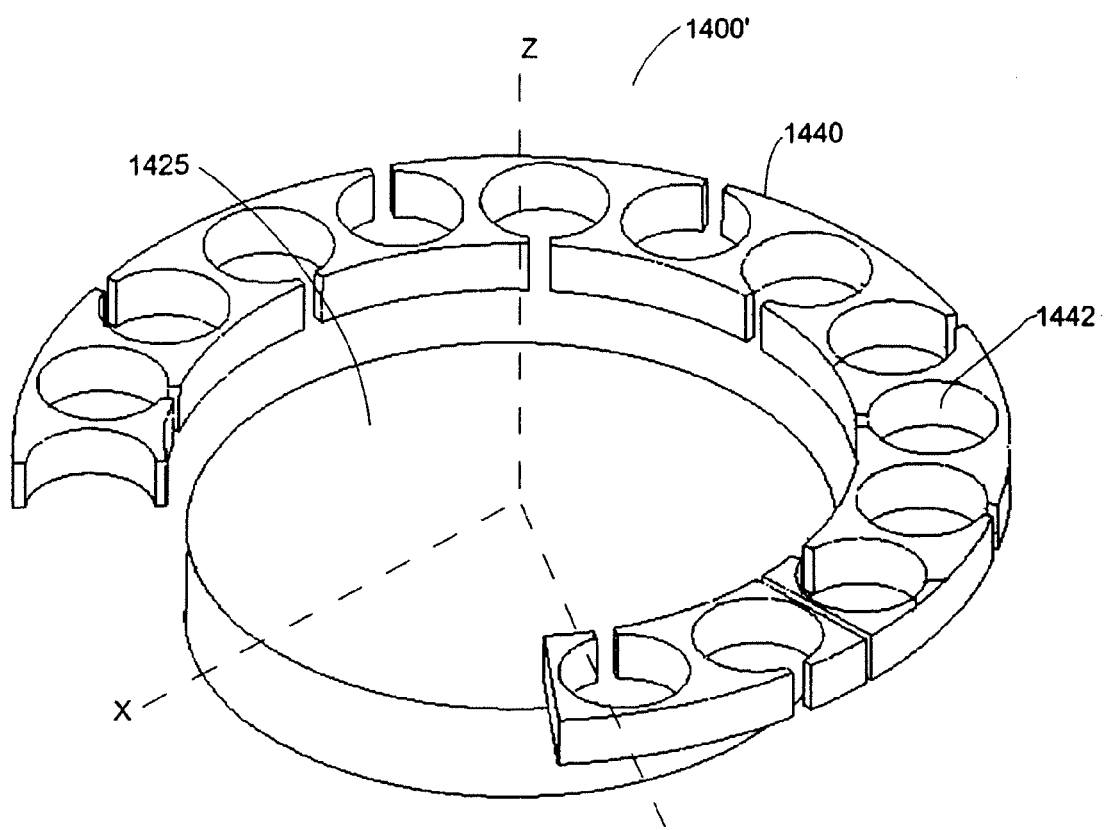

Other examples of inductive devices include the inductive devices depicted in FIGS. 11A, 11B, and 11C, 11D. As illustrated in FIGS. 11A and 11B, a peripheral inductive electrode assembly 1400 comprises a first inductive electrode 1430 surrounding the peripheral edge of substrate 1425. The electrode 1430 comprises orifices 1432 configured to permit the passage of processing gases there-through. In FIGS. 11C and 11D, a second electrode 1440 with orifices 1442 is shown. A typical frequency for the power supply can range from about 0.1 MHz to about 100 MHz.

Figure 12:
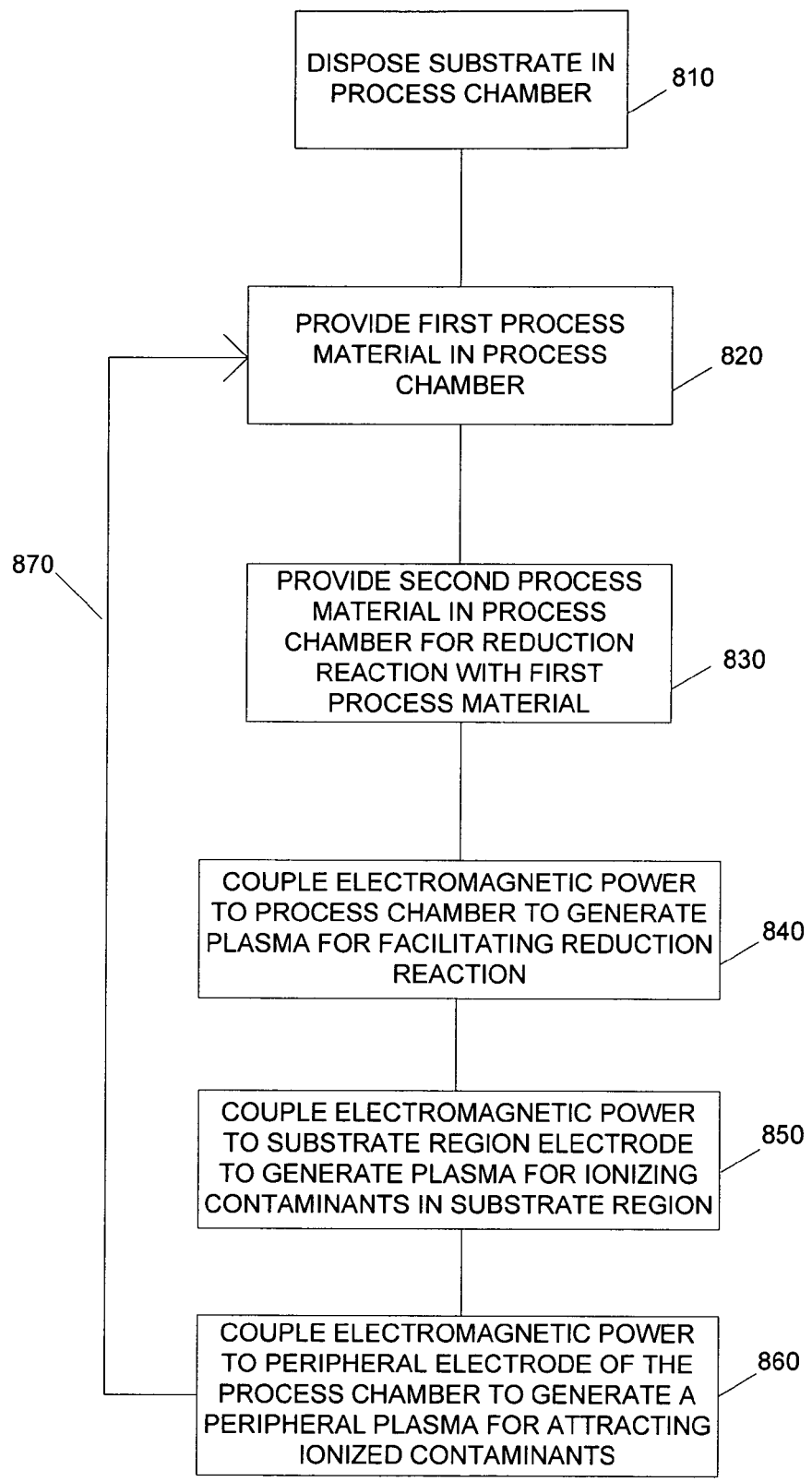
FIG. 12 shows a process flow diagram of an ALD process in accordance with an embodiment of the present invention.

FIG. 12 shows a process flow diagram of an ALD process in accordance with an embodiment of the present invention. The process of FIG. 12 may be performed by the processing system of FIG. 1B or 2B, or any other suitable processing system. As seen in FIG. 12, the process begins when a substrate is inserted in a process chamber in step 810. In step 820, the first process material is provided into the process chamber in order to adsorb to the substrate surface, and in step 830, the second process material is provided in the process chamber to provide a reduction reaction with the deposited first process material in order to form a desired film on the substrate surface. As with previous embodiments described herein, the first and second process materials are selected in accordance with a desired film to be deposited on the substrate. For example, any of the combinations of first and second process materials described herein may be applied to the process of FIG. 12.

In step 840, electromagnetic power is coupled to the process chamber during introduction of the second process material in order to facilitate a reduction reaction as discussed above. In the embodiment of FIG. 12, the power of step 840 is coupled to the process chamber through an electrode substantially in the region of the substrate, i.e., the substrate zone (A). In the embodiments of FIGS. 1B and 2B, the electrode may be at least one of the upper assembly electrode and the substrate holder electrode. Power coupled to the process chamber during step 840 is preferably above 600 W and can, for example, be approximately 1000 W in order to accelerate the reduction reaction and reduce contamination as discussed above. Moreover, a varying power may be coupled to the process chamber in order to provide further reduction of contaminants as discussed above. However, the power coupled during step 840 may be any power sufficient to maintain a plasma to facilitate the reduction reaction.

In step 850, power is coupled to the process chamber to generate a plasma for ionizing contaminants in the region of the substrate as described above. In an embodiment, step 850 of ionizing contaminants is performed as a consequence of generating a reduction reaction in step 840. That is, the process of generating a plasma in step 840 can naturally ionize contaminants in the substrate region thereby simultaneously performing step 850. In alternate embodiments, however, the process step for ionizing the contaminants can be performed independently of the reduction reaction step. For example, process conditioning such as plasma power, chamber environment and chamber pressure may be adjusted from the reduction plasma step in order to provide ideal ionization for the contaminants.

In step 860, power is coupled to a peripheral electrode such as the electrode 30A or the electrode 130A of FIGS. 1B and 2B respectively, in order to generate a plasma in the peripheral zone (B) of the process chamber. However, the peripheral plasma has a characteristic different from the substrate region plasma (i.e., substrate zone (A)) in order to generate a potential difference that attracts ionized contaminants from the substrate zone (A) as discussed above. For example, at least one of a frequency, phase, or power level of the power applied to the peripheral electrode may be different from that applied to the electrode in the upper assembly (process electrode) in order to achieve the desired plasma characteristic to provide a potential difference. In another embodiment, the peripheral plasma characteristic can be changed by injecting a gas from the peripheral electrode to alter the plasma composition in the peripheral region.

For instance, a plasma potential can be established according the highest (positive) potential at a significant surface area interfacing with the plasma boundary. Because the electrically biased surfaces in a PEALD system are the substrate electrode (20/120 in FIGS. 1A and 2A), and/or an upper electrode (30/130 in FIGS. 1A and 2A), the minimal dimensions for a peripheral electrode/device are: $R_{min}>(1.4\text{-}1.6) R_{wafer}$ for a single planar electrode (see e.g. FIG. 10A), or $R_{min}>(1.2\text{-}1.4) R_{wafer}$ for a dual planar electrode (see e.g. FIG. 10B), or $R_{min}>R_{wafer}$ and $d_{min}>R_{wafer}/2$ for a cylindrical electrode (see e.g. FIG. 10C). In these inequalities, $R_{min}$ is the radius of an inner portion of the peripheral electrode, $R_{wafer}$ is the radius of the wafer and $d_{min}$ is the height of the cylindrical electrode. In one embodiment, the height of the cylindrical electrode is selected such that the area of the electrode is approximately equivalent to the area of the substrate, however this is not required. When operating the plasma in the substrate zone (A), the plasma potential $V_A$ will be established in the substrate zone (A) (determined mostly by substrate area). Thereafter, initiating the peripheral plasma in peripheral zone (B) (timely overlapping the portion of the plasma interval in substrate zone (A)) will increase the plasma potential in the substrate zone (A) due to electron loss compensation by the peripheral plasma at the interface between the substrate zone (A) and the peripheral zone (B). By turning the primary plasma off (in the substrate zone (A)), the plasma potential in the substrate zone (A) will be reduced, or even completely decay leaving only the plasma potential $V_B$ existing in the peripheral zone (B) (determined by secondary electrode area). Because plasmas in the substrate zone (A) and the peripheral zone (B) differ in volume and boundary area size the plasma potentials will differ as well at comparable or equal powers. By experimentation one can establish the appropriate plasma potential in the peripheral zone (B) to maximize the residual gas removal from the system.

The peripheral plasma generation step 860 at least partially overlaps the substrate region plasma generation step 850 (as described above; see FIGS. 9B and 9C) in order to create the potential difference discussed above. Thus, in an embodiment where ionizing contaminants results from the reduction plasma, the second process material is introduced in step 830 while power is applied to the substrate region plasma electrode (in substrate zone (A)) to perform steps 840 and 850. Once the plasma assisted reduction reaction and ionization of contaminant(s) begin in steps 840 and 850, the peripheral plasma (in peripheral zone (B)) is generated in step 860 to attract the ionized contaminants away from the substrate zone (A), as discussed above. Power to the process and peripheral electrodes can then be shut off simultaneously after the reduction reaction takes place, or the plasma in the substrate zone (A) can first be turned off while the peripheral plasma (in peripheral zone (B)) is maintained to attract residual ionized contaminants. After the ionized contaminants are expelled from the process chamber, the processing steps 820 to 860 can be repeated to obtain a desired film thickness as shown by process arrow 870.

As noted above, the plasma in the substrate zone (A) and the peripheral zone (B) can be generated independently of the plasma generation step 840 for reduction reaction. In addition, while not shown in FIG. 12, as with previous embodiments, a purge gas can be introduced to the process chamber between the steps for introducing a first process material and the second process material and also after the reduction reaction, as discussed with respect to FIG. 3. The purge gas steps can use an inert gas and/or a reactive gas. Thus, substrate and peripheral plasmas can be generated in steps 850 and 860 during introduction of the first process material, introduction of a purge gas, or an additional plasma generation step in the ALD process in order to attract contaminants away from the substrate zone (A). In addition, it is to be understood that steps 850 and 860 do not need to be performed for each ALD cycle, and can be performed at intermittent cycles.

In yet another embodiment of the present invention, contaminants that affect the ALD process can be removed from the process chamber by vacuum pumping the chamber through gas injection orifices of a gas injection assembly. Specifically, the present inventors have recognized that during generation of a plasma within the processing system, power applied to a gas injection assembly causes the plurality of gas injection orifices to act as "hollow anodes" that attract species of the plasma including ionized contaminants. For example, when depositing tantalum-containing material as discussed above, chlorine contaminants in the process chamber can be ionized and attracted to hollow anodes of a gas injection assembly. The present inventors discovered that vacuum pumping the plurality of orifices during plasma generation can reduce the contaminants within the process chamber, thereby reducing the effects of the contaminants on the deposited film.

As previously discussed, FIGS. 1B and 2B show processing systems having an optional vacuum pump for pumping ionized contaminants from the process chamber through a gas injection assembly. Specifically, FIG. 1B shows a vacuum pump 34A coupled to the upper assembly 30, which can also serve as the gas injection assembly for at least one of the first process material supply system 40, the second process material supply system 42, or the purge gas supply system 44. While not shown in FIG. 1B, a separate gas injection system, such as a sidewall injection valve, is also included in the process chamber 10 in a manner well known to one of ordinary skill in the art. During generation of a plasma in the process chamber 10, power from the first power source 50 is applied to the upper assembly 30 having a plurality of gas injection orifices while vacuum pump 34A is used to pump ionized contaminants, attracted to the orifices by the hollow anode effect, from the process chamber through the gas injection orifices.

In the embodiment shown in FIG. 2B, the gas injection assembly 180 in the upper assembly 130 may include a plurality of sets of orifices for respective materials. Specifically, in the gas injection assembly 180, the first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184. As also seen in FIG. 2B, the first material line 141 and the second material line 143 may be coupled to vacuum pump 134A, thereby allowing vacuum pumping of the process chamber 110 through the first array of orifices, or the second array of orifices, or both. Process chamber 110 may also include a sidewall injection valve. During generation of a plasma in process chamber 110, vacuum pump 134A is used to pump ionized contaminants attracted to the orifices.

Figure 13:
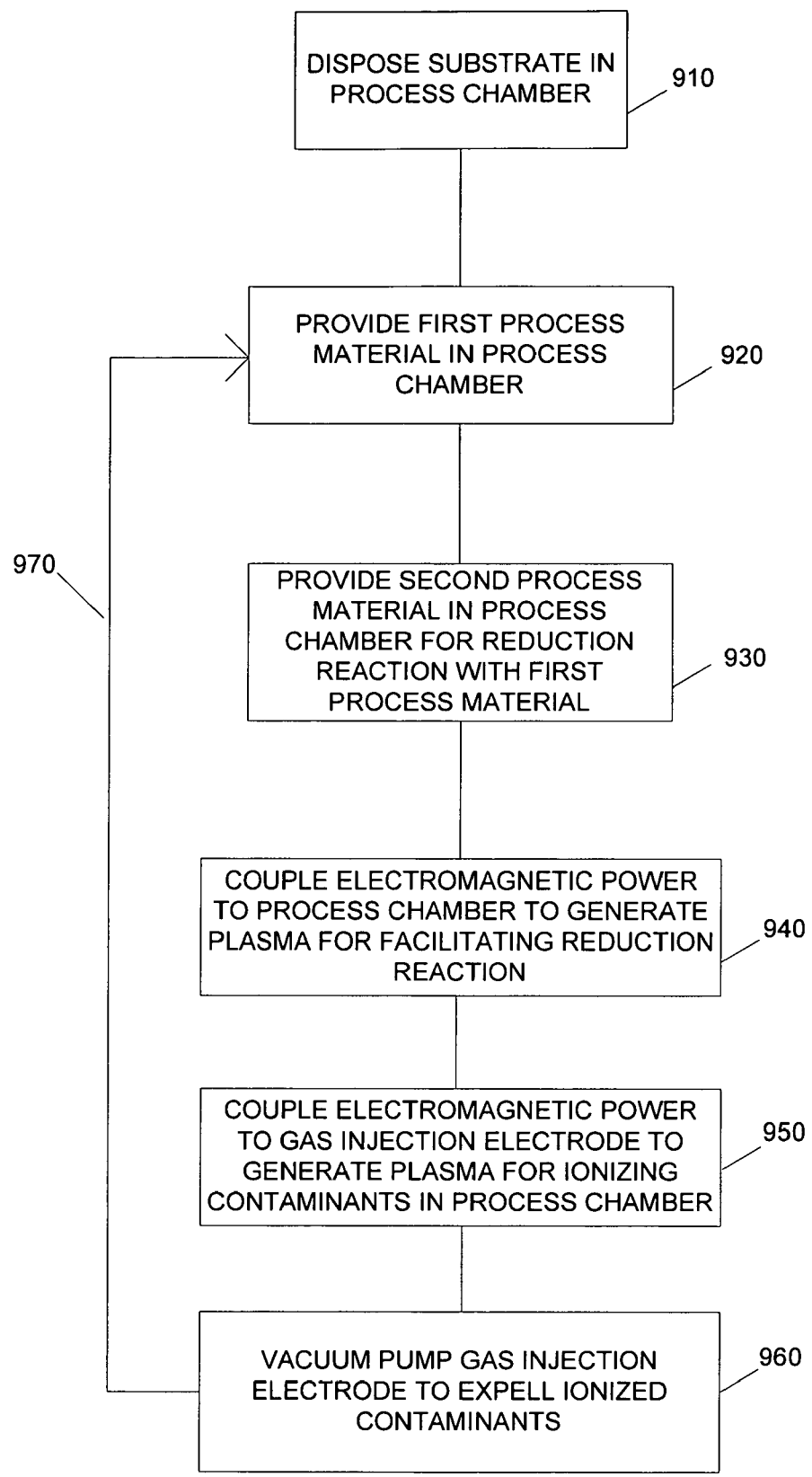
FIG. 13 shows a process flow diagram of an ALD process in accordance with an embodiment of the present invention.

FIG. 13 shows a process flow diagram of an ALD process in accordance with an embodiment of the present invention. The process of FIG. 13 may be performed by the processing system of FIG. 1B or 2B, or any other suitable processing system. As seen in FIG. 13, the process begins when a substrate is inserted in a process chamber in step 910. In step 920, the first process material is provided into the process chamber in order to adsorb to the substrate surface, and in step 930, the second process material is provided in the process chamber to provide a reduction reaction. The first and/or second process material may be introduced to the process chamber through a plurality of orifices in a gas injection electrode that is also used to generate a plasma and pump the process chamber as will be discussed further below. Moreover, as with previous embodiments described herein, the first and second process materials are selected in accordance with a desired film to be deposited on the substrate, and any of the combinations of first and second process materials described herein may be applied to the process of FIG. 13.

In step 940, electromagnetic power is coupled to the process chamber during introduction of the second process material in order to facilitate a reduction reaction. In the embodiment of FIG. 13, the power for generating a reduction reaction plasma is coupled to the process chamber through a gas injection system having a plurality of gas injection orifices, as described in FIGS. 1B and 2B. Power coupled to the process chamber during step 940 is preferably above 600 W and can, for example, be approximately 1000 W in order to accelerate the reduction reaction and reduce contamination as discussed above. However, the power coupled during step 940 may be any power sufficient to maintain a plasma to assist in the reduction reaction.

In step 950, power is applied to a gas injection electrode to generate a plasma for ionizing contaminants in the process chamber. The power applied to the gas injection electrode biases the electrode so that gas injection orifices also act as hollow anodes in step 950 to attract the ionized contaminants as discussed above. In an embodiment, step 950 of ionizing contaminants is performed as a consequence of generating the reduction reaction plasma in step 940. That is, the process of applying power to the gas injection electrode to generate a reduction reaction plasma in step 940 can naturally ionize contaminants and create hollow anodes thereby simultaneously performing step 950. In alternate embodiments, however, the process step for ionizing and attracting contaminants can be performed independently of the reduction reaction step.

In step 960, the ionized contaminants are vacuum pumped from the process chamber through a plurality of orifices in the gas injection electrode. The vacuum pumping step 960 at least partially overlaps the plasma generation step 950 in order to expel the ionized contaminants as discussed above. Thus, in an embodiment where ionizing the contaminants results from the reduction reaction plasma, steps 930, 940, 950 and 960 of FIG. 13 occur simultaneously. However, steps 950 and 960 of ionizing and expelling contaminants can be performed independently of the reduction reaction. After the ionized contaminants are expelled from the process chamber, the processing steps 920-960 can be repeated to obtain a desired film thickness as shown by process arrow 970.

While not shown in FIG. 13, the embodiment of this figure may include one or more purge gas steps as described in FIG. 3. Moreover, as noted above, the plasma and pumping steps can be performed at any time during the ALD process in order to clean the process chamber. Thus, the plasma for ionizing and attracting contaminants can be generated during at least one of introduction of the first process material, introduction of the second process material, introduction of a purge gas, or introduction of some other material suited for ionizing the contaminants in the process chamber. While gas injection orifices of the gas injection electrode are preferably used to perform one or more of these introduction steps, orifices used for vacuum pumping during the ionizing plasma cannot be also used for introduction of a process material in which the plasma is generated.

For example, in one embodiment, the first process material may be introduced in step 920 by gas injection orifices on the gas injection electrode. Then, in step 930, the second process material is introduced using a separate gas injection path while power is applied to the gas injection electrode in step 940 to generate a reduction reaction plasma. The alternative gas injection path may be, for example, the sidewall gas injection valve discussed in FIG. 1B, or a second set of gas injection orifices as discussed in FIG. 2B. The reduction reaction plasma generated in step 940 also serves to ionize the contaminants in the process chamber and attract such contaminants to the gas injection orifices in step 950. During the plasma assisted reduction reaction of steps 930, 940 and 950, the gas injection orifices used to introduce the first process material are vacuum pumped in order to remove ionized contaminants that have been attracted to the orifices due to the hollow anode affect.

As discussed above, various techniques may be employed within a PEALD processing system to remove contaminants such as chlorine from the processing system and/or a substrate processed in the PEALD system. The present inventors have recognized, however, that despite these efforts, contaminants can deposit on the ALD film during transfer of the substrate from the PEALD process chamber to a separate process chamber for further processing, such as interconnect metallization. The inventors have observed that the sheet resistance, after a 400 degrees C. anneal, of film structures consisting of an approximately 10 nm thick Cu layer, upon an approximately 6 nm thick layer of tantalum, upon an approximately 6 nm thick layer of tantalum nitride exhibits a significant increase when the tantalum layer is prepared with a PEALD process utilizing tantalum pentachloride as the film precursor. In this film structure, the Cu and tantalum nitride films are prepared using ionized PVD (i-PVD). For example, when the tantalum film is prepared using i-PVD, the sheet resistance is approximately 8.04 ohms/square and, when the tantalum film is prepared using PEALD (as described above), the sheet resistance is approximately 145 to 185 ohms/square and metal (copper) agglomeration is observed.

The present inventors have also recognized that the above described transfer contamination problems can occur for films deposited by non-plasma ALD, chemical vapor deposition (CVD), plasma enhanced chemical vapor deposition (PECVD), or any other deposition process. That is, despite efforts to reduce contamination within the deposition chamber itself, contaminants can affect the deposited film during transfer of the substrate from the deposition process chamber to a separate process chamber for further processing, such as interconnect metallization.

Thus, despite cleaning efforts in a PEALD or other deposition chamber, metallization can be deposited on a contaminated ALD or other deposited film, leading to operation and reliability problems in the end device. Based on this recognition, the present inventors have discovered that contaminants can be further reduced on the substrate by performing a plasma cleaning of the substrate after the substrate is removed from the deposition system.

Figure 14:
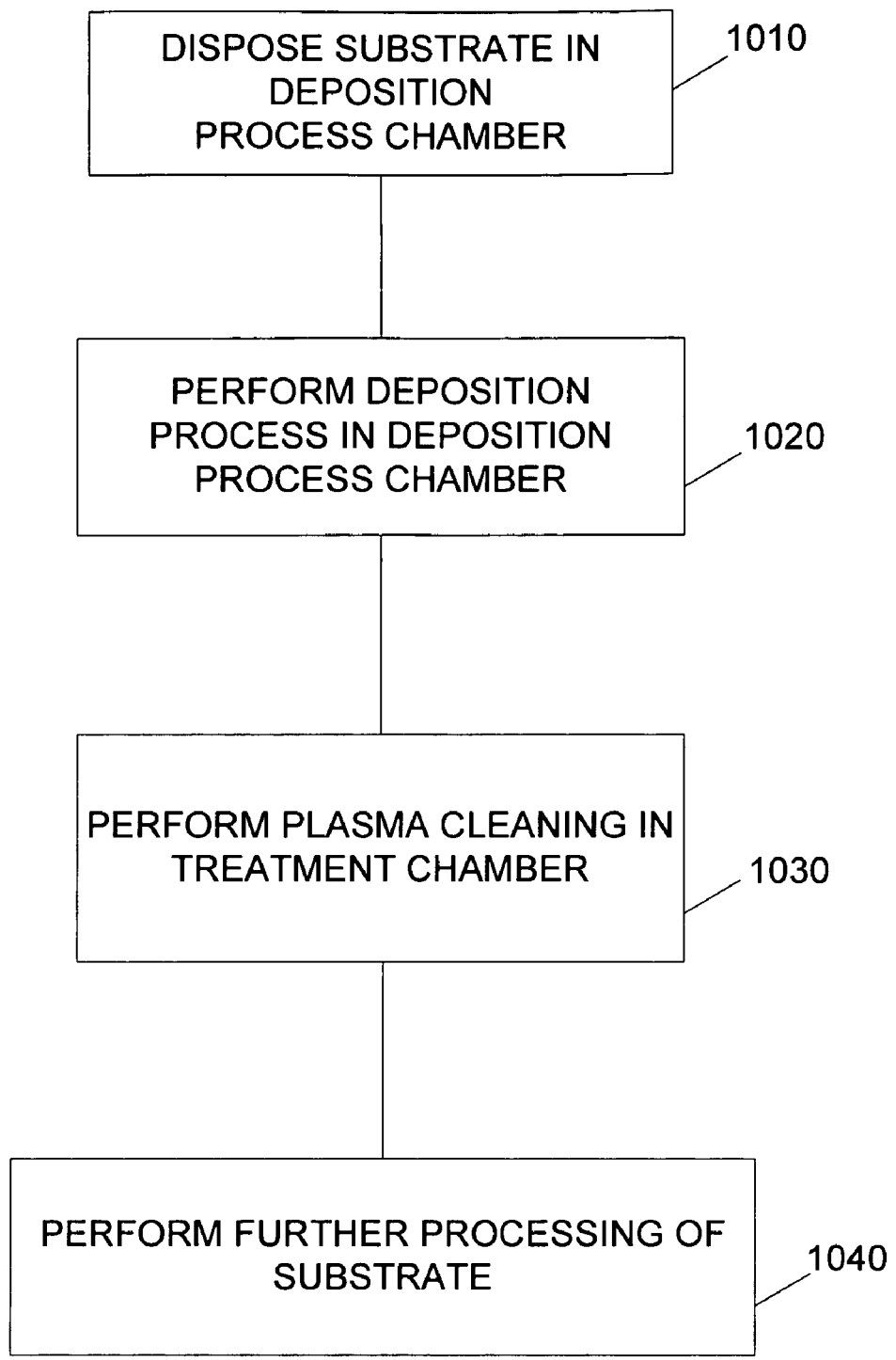
FIG. 14 shows a process flow diagram of a substrate process in accordance with an embodiment of the present invention.

FIG. 14 shows a process flow diagram of a substrate process in accordance with an embodiment of the present invention. The process begins in step 1010 when the substrate is deposited in a deposition chamber for deposition of a film. For example, the substrate may be deposited in the system of FIG. 1A or 2A described herein. In step 1020, a deposition process is performed in the deposition process chamber. In one embodiment, step 1020 is performed to deposit at least one of a barrier layer, a seed layer, an adhesion layer, a gate layer, a metal layer, a metal oxide layer, a metal nitride layer, or a dielectric layer on a substrate. Moreover, where the deposition process is a PEALD process, one or more of the PEALD processes described herein to accelerate the ALD process or reduce contamination may be performed as part of step 1020 of FIG. 14.

After completion of the deposition process, the substrate having the ALD film deposited thereon is transferred to a treatment chamber where a plasma cleaning is performed as shown by step 1030. The plasma cleaning is preferably performed with a plasma characterized by low electron temperature (less than about 1.5 eV) and high plasma density (>1× $10^{12}/cm^3$), that enables substantially damage-free cleaning of the deposited layer according to the invention. Such process parameters create a "soft plasma" that effectively reduces contaminants on the substrate surface (i.e., the deposited film such as an ALD film surface) without substantially damaging the deposited film. In step 1040, further processing is performed on the substrate. For example, step 1040 may include deposition of interconnect metallization on the deposited film.

In one embodiment of the invention, the plasma cleaning step 1030 is performed in a designated treatment chamber, and then transferred to an additional process chamber for performing processing step 1040. For example, the treatment chamber includes a slotted plane antenna (SPA) plasma source which will be described below.

In another embodiment, the plasma cleaning step 1030 is performed in the same chamber as the processing step 1040. For example, where processing step 1040 is a metallization step performed in an ionized physical vapor deposition (i-PVD) chamber, the plasma cleaning step 1030 can be performed in the i-PVD chamber prior to depositing the metal. Specifically, the i-IPVD process can be provided by an apparatus for sputtering conductive metal coating material from an annular magnetron sputtering target. Sputtering can be accomplished by applying a DC power to the target and the sputtered material is ionized in a processing space between a target and a substrate by generating a dense plasma in the space. The ionized sputter material is then drawn to the substrate surface by applying a bias to the substrate. Where the plasma cleaning step is performed in the i-PVD chamber, the substrate having an deposited film thereon is first exposed to an inert gas such as argon in the i-PVD chamber. Power is coupled to the i-PVD chamber to heat the inert gas and generate a plasma for reducing contaminants on the substrate surface, as described above. During the plasma cleaning treatment of the substrate, no power is coupled to the metal target, and the use of substrate bias power is optional. Once the cleaning step is completed, DC power to the metal target and substrate bias power is applied to perform the i-IPVD metallization process. The inventors have observed that the sheet resistance after 400° C. anneal of film structures consisting of an approximately 10 nm thick Cu layer, upon an approximately 6 nm thick layer of tantalum, upon an approximately 6 nm thick layer of tantalum nitride exhibits no increase when the tantalum layer is prepared with a PEALD process utilizing tantalum pentachloride as the film precursor and the plasma cleaning is performed. In addition, no copper agglomeration is observed.

Figure 15:
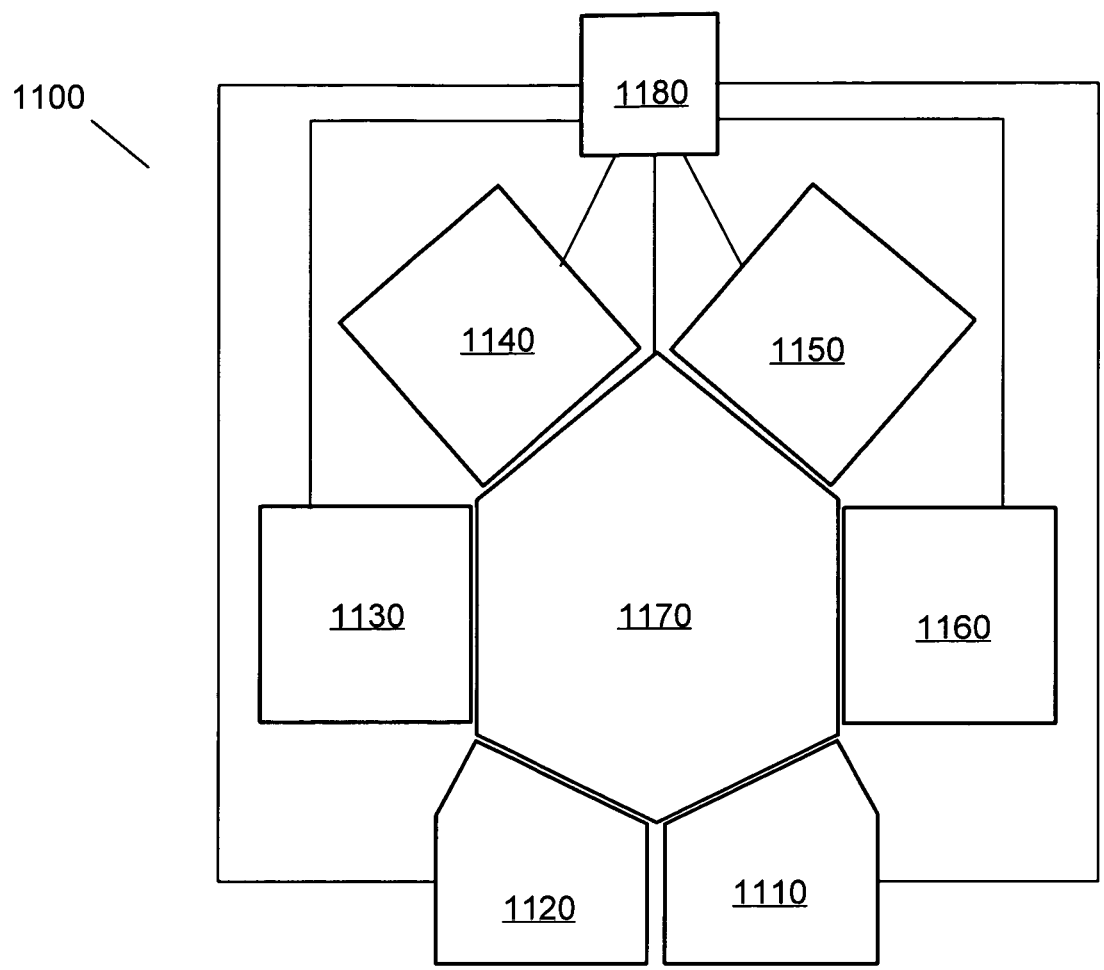
FIG. 15 is a simplified block diagram of a processing tool for processing a substrate in accordance with an embodiment of the present invention.

FIG. 15 is a simplified block diagram of a processing tool for processing a substrate in accordance with an embodiment of the present invention. The processing tool 1100 contains substrate loading chambers 1110 and 1120, processing systems 1130-1160, a robotic transfer system 1170 for transferring substrates within the processing tool 1100, and a controller 1180 for controlling the processing tool 1100. In one example, processing system 1130 can be utilized for pre-processing, such as cleaning, a substrate, and processing system 1140 can be utilized to perform a deposition process such as an ALD process, a PEALD process, a CVD process, a PECVD process or any other film deposition process. For example, processing system 1140 may be implemented as the system of FIG. 1 or 2 to perform one or more of the PEALD processes described herein.

In the embodiment of FIG. 15, processing system 1150 is an i-PVD chamber for depositing interconnect metallization as discussed above. Processing system 1160 is a designated treatment chamber having a plasma source, such as a SPA plasma source, as also discussed. The processing tool 1100 can be controlled by a controller 1180. The controller 1180 can be coupled to and exchange information with substrate loading chambers 1110 and 1120, processing systems 1130-1160, and robotic transfer system 1170.

Figure 16:
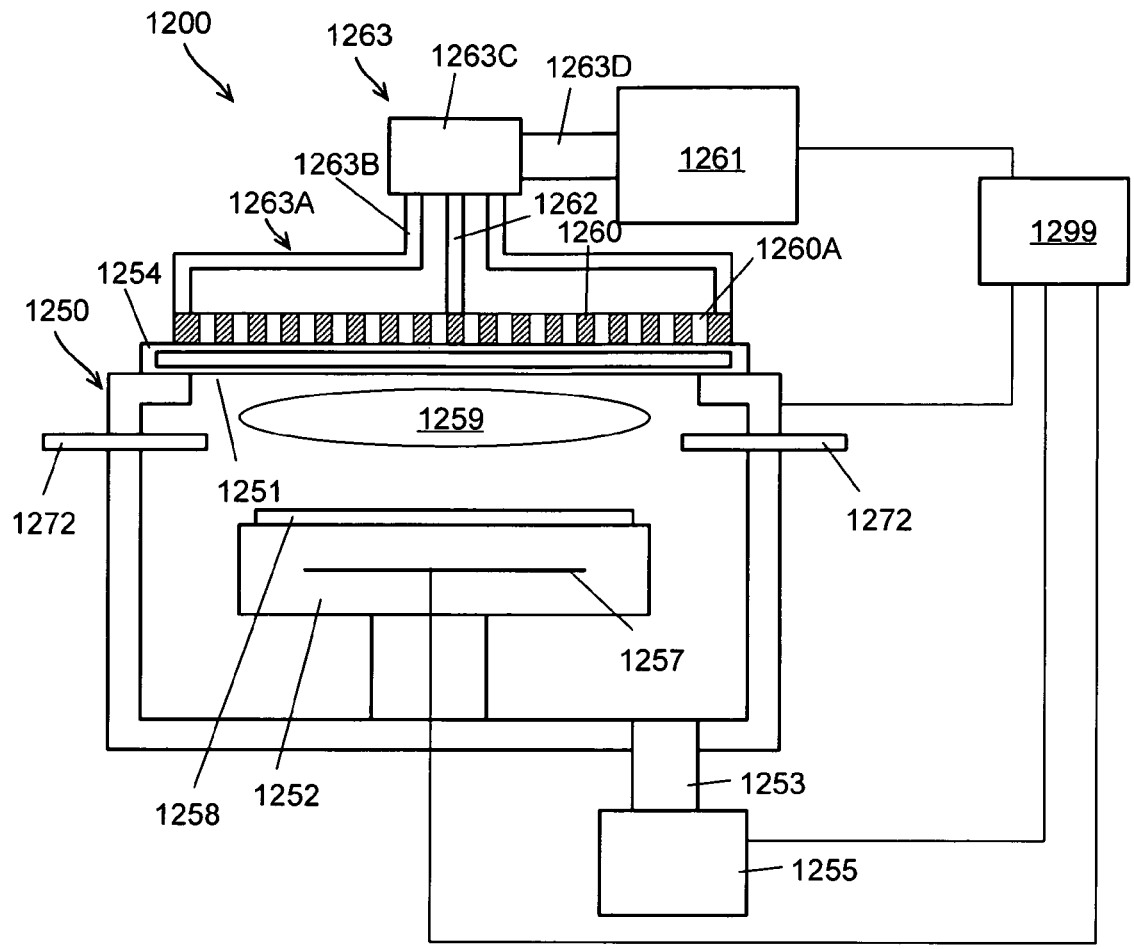
FIG. 16 is a simplified block-diagram of a plasma processing system containing a slot plane antenna (SPA) plasma source for generating a soft plasma for reducing contaminants on an ALD layer.

FIG. 16 is a simplified block-diagram of a plasma processing system containing a slot plane antenna (SPA) plasma source for generating a plasma for reducing contaminants on a deposited film such as an ALD layer. The plasma produced in the plasma processing system 1200 is characterized by low electron temperature (less than about 1.5 eV) and high plasma density (>1×$10^{12}/cm^3$), that enables substantially damage-free cleaning of the ALD layer according to the invention. The plasma processing system 1200 can, for example, be a TRIAS™ SPA processing system, commercially available from Tokyo Electron Limited, Akasaka, Japan. The plasma processing system 1200 contains a process chamber 1250 having an opening portion 1251 in the upper portion of the process chamber 1250 that is larger than a substrate 1258. A cylindrical top plate 1254 made of quartz, aluminum oxide, silicon, or aluminum nitride is provided to cover the opening portion 1251. Gas lines 1272 are located in the side wall of the upper portion of process chamber 1250 below the top plate 1254. In one example, the number of gas lines 1272 can be 16 (only two are which are shown in FIG. 16). Alternately, a different number of gas feed lines 1272 can be used. The gas lines 1272 can be circumferentially arranged in the process chamber 1250, but this is not required for the invention. A process gas can be evenly and uniformly supplied into the plasma region 1259 in process chamber 1250 from the gas lines 1272.

In the plasma processing system 1250, microwave power is provided to the process chamber 1250 through the top plate 1254 via a plane antenna member 1260 having a plurality of slots 1260A. The slot plane antenna 1260 can be made from a metal plate, for example copper. In order to supply the microwave power to the slot plane antenna 1260, a waveguide 1263 is disposed on the top plate 1254, where the waveguide 1263 is connected to a microwave power supply 1261 for generating microwaves with a frequency of 2.45 GHz, for example. The waveguide 1263 contains a flat circular waveguide 1263A with a lower end connected to the slot plane antenna 1260, a circular (coaxial) waveguide 1263B connected to the upper surface side of the circular waveguide 1263A, and an outport (bottom surface in FIG. 16) of a coaxial waveguide converter 1263C connected to the upper surface side of the circular (coaxial) waveguide 1263B. Furthermore, a rectangular waveguide 1263D is connected to the input port (side surface in FIG. 16) of the coaxial waveguide converter 1263C and the microwave power supply 1261.

Inside the circular waveguide 1263B, an axial portion 1262 (or inner conductor) of an electro-conductive material is coaxially provided, so that one end of the axial portion 1262 is connected to the central (or nearly central) portion of the upper surface of slot plane antenna 1260, and the other end of the axial portion 1262 is connected to the upper surface of the circular waveguide 1263B, thereby forming a coaxial structure. As a result, the circular waveguide 1263B is constituted so as to function as a coaxial waveguide. The microwave power can, for example, be between about 0.5 W/cm$^2$ and about 4 W/cm$^2$. Alternately, the microwave power can be between about 0.5 W/cm$^2$ and about 3 W/cm$^2$.

In addition, in the vacuum process chamber 1250, a substrate holder 1252 is provided opposite the top plate 1254 for supporting and heating a substrate 1258 (e.g., a wafer). The substrate holder 1252 contains a heater 1257 to heat the substrate 1258, where the heater 1257 can be a resistive heater. Alternately, the heater 1257 may be a lamp heater or any other type of heater. Furthermore the process chamber 1250 contains an exhaust line 1253 connected to the bottom portion of the process chamber 1250 and to a vacuum pump 1255.

Still referring to FIG. 16, a controller 1299 includes a microprocessor, a memory, and a digital I/O port capable of generating control voltages sufficient to communicate and activate inputs of the plasma processing system 1200 as well as monitor outputs from the plasma processing system 1200. Moreover, the controller 1299 is coupled to and exchanges information with process chamber 1250, the pump 1255, the heater 1257, and the microwave power supply 1261. A program stored in the memory is utilized to control the aforementioned components of plasma processing system 1200 according to a stored process recipe. One example of processing system controller 1299 is a UNIX-based workstation. Alternately, the controller 1299 can be implemented as a general-purpose computer, digital signal processing system, or any of the controllers described herein. Moreover, the controller 1299 may be locally located relative to the plasma processing system 1200 or it may be remotely located relative to the plasma processing system 1200 via an internet or intranet. For additional details, a plasma process system having a slotted plane antenna (SPA) plasma source is described in co-pending European Patent Application EP1361605A1, titled "METHOD FOR PRODUCING MATERIAL OF ELECTRONIC DEVICE.", the entire contents of which is hereby incorporated by reference.

Although only certain exemplary embodiments of inventions have been described in detail above, those skilled in the art will readily appreciate that many modifications are possible in the exemplary embodiments without materially departing from the novel teachings and advantages of this invention. For example, various techniques have been disclosed herein for improving ALD cycle times and reducing contamination of ALD films. Any combination or all of these features can be implemented in a single ALD processing system. Accordingly, all such modifications are intended to be included within the scope of this invention.

The invention claimed is:

1. A method for depositing a film on a substrate using a plasma enhanced atomic layer deposition (PEALD) process, comprising:
    disposing said substrate in a process chamber configured to facilitate said PEALD process;
    introducing a first process material within said process chamber;
    introducing a second process material within said process chamber;
    coupling electromagnetic power to said process chamber during introduction of the second process material in order to generate a plasma that facilitates a reduction reaction between the first and second process materials at a surface of said substrate;
    coupling electromagnetic power to a gas injection electrode to generate a plasma that ionizes contaminants such that the ionized contaminants are attracted to a plurality of orifices in said gas injection electrode; and
    vacuum pumping said process chamber through said plurality of orifices to expel said ionized contaminants from said process chamber,
    wherein the step of coupling electromagnetic power to the gas injection electrode comprises coupling electromagnetic power to the gas injection electrode after the step of coupling electromagnetic power to said process chamber.

2. The method of claim 1, wherein said introducing a first process material comprises introducing a process material comprising TaF$_5$, TaCl$_5$, TaBr$_5$, TaI$_5$, Ta(CO)$_5$, PEMAT, PDMAT, PDEAT, TBTDET, Ta(NC$_2$H$_5$)(N(C$_2$H$_5$)$_2$)$_3$, Ta(NC(CH$_3$)$_2$C$_2$H$_5$)(N(CH$_3$)$_2$)$_3$, Ta(NC(CH$_3$)$_3$)(N(CH$_3$)$_2$)$_3$, TiF$_4$, TiCl$_4$, TiBr$_4$, TiI$_4$, TEMAT, TDMAT, TDEAT, Ti(NO$_3$)$_4$, WF$_6$, W(CO)$_6$, MoF$_6$, Cu(TMVS)(hfac), CuCl, Zr(NO$_3$)$_4$, ZrCl$_4$, Hf(OBu$^t$)$_4$, Hf(NO$_3$)$_4$, HfCl$_4$, NbCl$_5$, ZnCl$_2$, Si(OC$_2$H$_5$)$_4$, Si(NO$_3$)$_4$, SiCl$_4$, SiH$_2$Cl$_2$, Al$_2$Cl$_6$, Al(CH$_3$)$_3$, Ga(NO$_3$)$_3$, Ga(CH$_3$)$_3$, or a combination of two or more thereof.

3. The method of claim 1, wherein said introducing a second process material comprises introducing a process material comprising H$_2$, N$_2$, O$_2$, H$_2$O, NH$_3$, H$_2$O$_2$, SiH$_4$, SiH$_6$, N$_2$H$_4$, NH(CH$_3$)$_2$, N$_2$H$_3$CH$_3$, or a combination of two or more thereof.

4. The method of claim 1, wherein said coupling electromagnetic power to the process chamber comprises coupling at least 600 W of power to the process chamber.

5. The method of claim 4, wherein said coupling electromagnetic power to the process chamber comprises coupling at least 1000 W of power to the process chamber.

6. The method of claim 1, wherein said coupling electromagnetic power to the process chamber and said coupling electromagnetic power to said process electrode are performed as a single coupling step during said introducing a second process material.

7. The method of claim 6, wherein:
    said introducing a first process material comprises introducing the first process material through said plurality of orifices; and
    said introducing a second process material comprises introducing the second process material through a different gas injection path while said plurality of orifices are used to vacuum pump said process chamber.

8. The method of claim 7, wherein said introducing a second process material comprises introducing the second process material through a sidewall gas injection valve.

9. The method of claim 7, wherein said introducing a second process material comprises introducing the second process material through different orifices of said gas injection electrode not used to vacuum pump said process chamber.

10. The method of claim 1, wherein said coupling electromagnetic power to said process chamber and said coupling electromagnetic power to said gas injection electrode are performed as separate coupling steps.

11. The method of claim 10, wherein said coupling electromagnetic power to said gas injection electrode is performed during at least one of introducing said first process material, introducing said second process material, or introducing a purge gas within said process chamber, while a corresponding one of said first process material, said second process material, or said purge gas is injected into said process chamber through a different gas injection path.

12. The method of claim 11, wherein said different gas injection path comprises at least one of a sidewall gas injection valve or different orifices of said gas injection electrode not used to vacuum pump said process chamber.

13. The method of claim 1, further comprising introducing a purge gas within said process chamber between introducing first and second process materials.

14. The method of claim 13, wherein said coupling electromagnetic power to said gas injection electrode and said vacuum pumping are performed during said introducing a purge gas.

15. The method of claim 13, wherein said introducing a purge gas comprises introducing at least one of an inert gas or a reactive gas within said process chamber.

16. The method of claim 1, further comprising forming a barrier layer, a seed layer, an adhesion layer, a gate layer, a metal layer, a metal oxide layer, a metal nitride layer, a dielectric layer on said substrate, or a combination of two or more thereof.

17. The method of claim 1, wherein:
said introducing a first process material comprises introducing $TaCl_5$ to said process chamber;
said introducing a second process material comprises introducing $H_2$ to said process chamber;
said coupling power to a gas injection electrode comprises ionizing chlorine contaminants and attracting the ionized chlorine contaminants to said gas injection electrode; and
said vacuum pumping comprises pumping the ionized chlorine contaminants through said plurality of orifices.

18. The method of claim 1, wherein the step of vacuum pumping said process chamber comprises vacuum pumping said process chamber through said plurality of orifices to expel said ionized contaminants from said process chamber during the generation of the plasma that ionizes contaminants.

19. The method of claim 1, wherein the step of vacuum pumping at least partially overlaps with the step of coupling electromagnetic power to the gas injection electrode.

20. The method of claim 1, wherein the step of vacuum pumping said process chamber through said plurality of orifices comprises vacuum pumping said process chamber through said plurality of orifices that are coupled to a vacuum pump.

21. The method of claim 1, wherein the step of vacuum pumping said process chamber through said plurality of orifices comprises vacuum pumping said process chamber through said plurality of orifices, which directly expels said ionized contaminants to outside said process chamber.

* * * * *